(12) United States Patent
Wang et al.

(10) Patent No.: US 12,352,788 B2
(45) Date of Patent: Jul. 8, 2025

(54) THERMAL RUNAWAY PROGNOSIS BY DETECTING ABNORMAL CELL VOLTAGE AND SOC DEGENERATION

(71) Applicant: GM Global Technology Operations LLC, Detroit, MI (US)

(72) Inventors: Yue-Yun Wang, Troy, MI (US); Andrew C. Baughman, Northville, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 1061 days.

(21) Appl. No.: 17/244,038

(22) Filed: Apr. 29, 2021

(65) Prior Publication Data
US 2022/0352737 A1 Nov. 3, 2022

(51) Int. Cl.
*G01R 31/36* (2020.01)
*G01R 19/00* (2006.01)
(Continued)

(52) U.S. Cl.
CPC ..... *G01R 19/003* (2013.01); *G01R 19/16528* (2013.01); *G01R 31/3648* (2013.01);
(Continued)

(58) Field of Classification Search
CPC .............. G01R 19/003; G01R 31/3648; G01R 31/3835; G01R 31/389; G01R 31/392; G01R 31/396; H01M 10/441; H01M 10/482; H01M 10/48; H02J 7/0014; H02J 7/0047
(Continued)

(56) References Cited

U.S. PATENT DOCUMENTS

| | | | | | |
|---|---|---|---|---|---|
| 4,044,300 A | * | 8/1977 | Dupuis | ................ | G01R 31/396 324/434 |
| 4,053,824 A | * | 10/1977 | Dupuis | .............. | G01R 31/3835 324/436 |

(Continued)

FOREIGN PATENT DOCUMENTS

| CN | 106802396 A | * | 6/2017 | ........... G01R 31/367 |
|---|---|---|---|---|
| CN | 107192914 A | | 9/2017 | |

(Continued)

OTHER PUBLICATIONS

Chinese Application No. 202210453671.8 filed Apr. 24, 2022; Chinese Office Action dated Nov. 20, 2024; 8 pages.

*Primary Examiner* — John T Trischler
(74) *Attorney, Agent, or Firm* — CANTOR COLBURN LLP

(57) ABSTRACT

A vehicle, system and method for monitoring an occurrence of thermal runaway in a battery pack of the vehicle. The system includes a plurality of voltage sensors and a processor. The plurality of voltage sensors obtains a plurality of voltage measurements at each of a plurality of battery cells of the battery pack. The processor is configured to determine a mean value based on the plurality of voltage measurements, compare a voltage measurement obtained from a selected battery cell to the mean value, and generate a notification signal when a difference between the voltage measurement from the selected battery cell and the mean value is greater than or equal to a prognostic threshold.

20 Claims, 12 Drawing Sheets

(51) Int. Cl.
| | |
|---|---|
| *G01R 19/165* | (2006.01) |
| *G01R 31/3835* | (2019.01) |
| *G01R 31/389* | (2019.01) |
| *G01R 31/392* | (2019.01) |
| *G01R 31/396* | (2019.01) |
| *H01M 10/44* | (2006.01) |
| *H01M 10/48* | (2006.01) |
| *H02J 7/00* | (2006.01) |
| *B60L 3/00* | (2019.01) |
| *G01R 29/04* | (2006.01) |
| *G01R 31/367* | (2019.01) |
| *G01R 31/374* | (2019.01) |
| *H01M 10/42* | (2006.01) |

(52) U.S. Cl.
CPC ....... *G01R 31/3835* (2019.01); *G01R 31/389* (2019.01); *G01R 31/392* (2019.01); *G01R 31/396* (2019.01); *H01M 10/441* (2013.01); *H01M 10/48* (2013.01); *H01M 10/482* (2013.01); *H02J 7/0014* (2013.01); *H02J 7/0047* (2013.01); *B60L 3/0046* (2013.01); *B60L 3/0069* (2013.01); *G01R 29/04* (2013.01); *G01R 31/367* (2019.01); *G01R 31/374* (2019.01); *H01M 2010/4271* (2013.01); *H01M 2220/20* (2013.01); *H02J 7/00309* (2020.01); *H02J 7/0048* (2020.01)

(58) Field of Classification Search
USPC .................................. 320/134, 136
See application file for complete search history.

(56) References Cited

U.S. PATENT DOCUMENTS

| | | | | |
|---|---|---|---|---|
| 4,633,418 A * | 12/1986 | Bishop | G01R 31/3648 | 340/636.15 |
| 5,644,212 A * | 7/1997 | Takahashi | H02J 7/0016 | 320/164 |
| 5,656,920 A * | 8/1997 | Cherng | B60L 58/22 | 320/161 |
| 5,828,201 A * | 10/1998 | Hoffman, Jr. | B60W 10/26 | 903/903 |
| 5,869,950 A * | 2/1999 | Hoffman, Jr. | B60W 10/26 | 320/132 |
| 5,994,873 A * | 11/1999 | Shiojima | H02J 7/0016 | 320/136 |
| 6,310,783 B1 * | 10/2001 | Winch | H02J 7/0029 | 361/679.48 |
| 6,404,165 B1 * | 6/2002 | Shinpo | B60L 58/10 | 320/124 |
| 6,417,648 B2 * | 7/2002 | Suzuki | H02J 7/0016 | 320/136 |
| 6,420,852 B1 * | 7/2002 | Sato | H01M 10/482 | 320/134 |
| 6,472,879 B2 * | 10/2002 | Park | G01R 31/3648 | 324/426 |
| 6,501,986 B1 * | 12/2002 | Schaldach | A61N 1/3956 | 607/7 |
| 6,621,269 B2 * | 9/2003 | Ward | F02D 41/221 | 324/388 |
| 6,710,575 B2 * | 3/2004 | Youn | B60L 3/0046 | 320/104 |
| 6,727,708 B1 * | 4/2004 | Dougherty | B60L 58/12 | 320/132 |
| 7,061,246 B2 * | 6/2006 | Dougherty | G01R 31/36 | 324/426 |
| 7,132,833 B2 * | 11/2006 | Layden | H02J 7/0029 | 324/429 |
| 7,176,654 B2 * | 2/2007 | Meyer | H02J 7/0069 | 320/110 |
| 7,262,580 B2 * | 8/2007 | Meyer | H02J 7/0031 | 320/141 |
| 7,311,364 B2 * | 12/2007 | Robertson | B60T 7/20 | 303/7 |
| 7,321,219 B2 * | 1/2008 | Meyer | H02J 7/00047 | 320/125 |
| 7,323,847 B2 * | 1/2008 | Meyer | H02J 7/0031 | 320/110 |
| 7,400,114 B2 * | 7/2008 | Anzawa | H02J 7/0016 | 320/118 |
| 7,425,816 B2 * | 9/2008 | Meyer | H01M 10/4207 | 320/141 |
| 7,508,167 B2 * | 3/2009 | Meyer | H02J 7/0014 | 320/135 |
| 7,528,575 B2 * | 5/2009 | Murakami | G01R 31/396 | 320/132 |
| 7,548,821 B2 * | 6/2009 | Tae | G01R 31/389 | 702/63 |
| 7,786,701 B2 * | 8/2010 | Altemose | H02J 7/0018 | 320/136 |
| 7,834,593 B2 * | 11/2010 | Johnson | H01M 10/443 | 320/150 |
| 8,018,198 B2 * | 9/2011 | Meyer | H02J 7/0069 | 320/136 |
| 8,044,637 B2 * | 10/2011 | Thivierge | H02J 7/0014 | 320/153 |
| 8,054,034 B2 * | 11/2011 | Lim | B60L 58/15 | 324/427 |
| 8,088,525 B2 * | 1/2012 | Ganapathy | H01M 8/04641 | 429/432 |
| 8,334,676 B2 * | 12/2012 | Hara | H01M 10/4257 | 429/211 |
| 8,525,479 B2 * | 9/2013 | Meyer | H02J 7/0013 | 320/135 |
| 8,560,257 B2 * | 10/2013 | Tang | H01M 10/486 | 702/65 |
| 8,614,563 B2 * | 12/2013 | Baughman | H02J 7/0016 | 320/118 |
| 8,725,330 B2 * | 5/2014 | Failing | B60L 53/12 | 701/22 |
| 8,795,908 B2 * | 8/2014 | Kaito | H01M 8/04552 | 429/408 |
| 8,836,285 B2 * | 9/2014 | Yamada | H02J 3/32 | 320/126 |
| 8,841,881 B2 * | 9/2014 | Failing | H02J 50/10 | 320/108 |
| 9,112,247 B2 * | 8/2015 | Yamauchi | H01M 10/425 | |
| 9,114,719 B1 * | 8/2015 | Failing | B60L 55/00 | |
| 9,118,189 B2 * | 8/2015 | Meyer | H02J 7/00047 | |
| 9,148,028 B2 * | 9/2015 | Suzuki | H02J 7/0014 | |
| 9,190,853 B2 * | 11/2015 | Johnson | H02J 7/0014 | |
| 9,213,068 B2 * | 12/2015 | Baughman | G01R 31/3835 | |
| 9,267,996 B2 * | 2/2016 | Baughman | H02J 7/00 | |
| 9,393,878 B1 * | 7/2016 | Failing | B60L 53/67 | |
| 9,804,230 B2 * | 10/2017 | Akaishi | G07C 5/0841 | |
| 9,857,431 B2 * | 1/2018 | Baughman | G01R 31/396 | |
| 9,933,489 B2 * | 4/2018 | Iino | G01R 31/3835 | |
| 10,008,864 B2 * | 6/2018 | Meyer | H02J 7/00711 | |
| 10,101,402 B2 * | 10/2018 | Frost | G01R 31/367 | |
| 10,124,691 B1 * | 11/2018 | Failing | B60L 53/67 | |
| 10,203,377 B2 * | 2/2019 | Fukuhara | G01R 31/392 | |
| 10,330,732 B2 * | 6/2019 | Roumi | G01R 31/367 | |
| 10,333,182 B2 * | 6/2019 | Gibbs | G01R 19/16542 | |
| 10,374,443 B2 * | 8/2019 | Meyer | H02J 7/0048 | |
| 10,493,848 B2 * | 12/2019 | Ono | B60L 3/0046 | |
| 10,714,948 B2 * | 7/2020 | Meyer | H02J 7/007194 | |
| 10,809,302 B2 * | 10/2020 | Yuan | H01M 10/48 | |
| 10,988,049 B2 * | 4/2021 | Wang | G01R 31/367 | |
| 11,035,904 B2 * | 6/2021 | Cho | G01R 31/392 | |
| 11,063,446 B2 * | 7/2021 | Meyer | H02J 7/0036 | |
| 11,067,633 B2 * | 7/2021 | Matsushita | G01R 31/374 | |
| 11,073,564 B2 * | 7/2021 | Roumi | G01R 31/52 | |
| 11,186,192 B1 * | 11/2021 | Failing | B60L 53/60 | |
| 11,187,753 B2 * | 11/2021 | Gupta | G01R 31/3646 | |
| 11,204,393 B2 * | 12/2021 | Chen | G01R 31/385 | |
| 11,225,169 B2 * | 1/2022 | Wang | B60R 16/0231 | |
| 11,299,063 B2 * | 4/2022 | Wang | H02J 7/0063 | |

(56) References Cited

U.S. PATENT DOCUMENTS

| | | | |
|---|---|---|---|
| 11,327,121 B2* | 5/2022 | Pressman | G01R 31/3648 |
| 11,394,330 B2* | 7/2022 | Wang | H02J 7/18 |
| 11,485,239 B2* | 11/2022 | Wang | G01R 31/3835 |
| 11,567,134 B2* | 1/2023 | Roumi | G01R 31/392 |
| 11,575,173 B2* | 2/2023 | Cornelli | H02J 7/00714 |
| 11,621,573 B2* | 4/2023 | Wang | H02J 7/005 320/134 |
| 11,626,633 B2* | 4/2023 | Baughman | H01M 10/425 429/62 |
| 11,656,292 B2* | 5/2023 | Yoon | G01R 31/392 324/426 |
| 11,733,309 B2* | 8/2023 | Wang | B60L 3/0069 324/426 |
| 11,757,391 B1* | 9/2023 | Hao | B60L 15/20 318/472 |
| 11,784,359 B2* | 10/2023 | Wang | H01M 10/48 429/90 |
| 11,815,559 B2* | 11/2023 | Yoon | G01R 31/367 |
| 11,904,703 B2* | 2/2024 | Deng | G01R 31/3835 |
| 2002/0002478 A1 | 1/2002 | Swart | G06Q 10/06 705/14.14 |
| 2002/0011820 A1* | 1/2002 | Suzuki | H02J 7/0014 320/132 |
| 2002/0070707 A1* | 6/2002 | Sato | H01M 10/482 320/134 |
| 2002/0084768 A1* | 7/2002 | Youn | B60L 3/0046 320/104 |
| 2002/0084785 A1* | 7/2002 | Park | G01R 31/3648 324/433 |
| 2002/0095319 A1* | 7/2002 | Swart | G06Q 10/02 705/6 |
| 2002/0095328 A1* | 7/2002 | Swart | G06Q 10/04 705/14.53 |
| 2002/0095391 A1* | 7/2002 | Swart | G06Q 10/025 705/400 |
| 2002/0099613 A1* | 7/2002 | Swart | G06Q 30/0205 705/26.1 |
| 2002/0136042 A1* | 9/2002 | Layden | H01M 50/284 363/146 |
| 2002/0149370 A1* | 10/2002 | Ward | F02D 41/221 324/388 |
| 2004/0189257 A1* | 9/2004 | Dougherty | H02J 7/005 320/132 |
| 2004/0263119 A1* | 12/2004 | Meyer | H02J 7/0042 320/116 |
| 2005/0077780 A1* | 4/2005 | Robertson | B60T 7/20 303/7 |
| 2005/0127747 A1* | 6/2005 | Robertson | B60T 7/20 303/20 |
| 2006/0071634 A1* | 4/2006 | Meyer | H02J 7/0071 320/112 |
| 2006/0108975 A1* | 5/2006 | Meyer | H02J 7/00038 320/107 |
| 2006/0108983 A1* | 5/2006 | Meyer | H02J 7/0014 320/128 |
| 2006/0273802 A1* | 12/2006 | Murakami | G01R 31/3835 324/434 |
| 2007/0103109 A1* | 5/2007 | Meyer | H02J 7/0036 320/103 |
| 2007/0273334 A1* | 11/2007 | Meyer | H02J 7/0048 320/145 |
| 2008/0018305 A1* | 1/2008 | Altemose | H02J 7/0048 320/134 |
| 2008/0090133 A1* | 4/2008 | Lim | H02J 7/0016 429/50 |
| 2008/0091362 A1* | 4/2008 | Tae | G01R 31/396 702/63 |
| 2008/0311449 A1* | 12/2008 | Kaito | H01M 8/04 73/335.03 |
| 2009/0153101 A1* | 6/2009 | Meyer | H02J 7/00038 320/119 |
| 2009/0197155 A1* | 8/2009 | Ganapathy | H01M 8/04552 429/90 |
| 2009/0218990 A1* | 9/2009 | Johnson | H01M 10/443 320/137 |
| 2010/0079116 A1* | 4/2010 | Thivierge | B60L 58/22 320/153 |
| 2010/0085009 A1* | 4/2010 | Kang | H02J 7/0019 324/427 |
| 2011/0121785 A1* | 5/2011 | Iida | H01M 10/486 903/907 |
| 2011/0169450 A1* | 7/2011 | Hudnall | H02J 7/0019 320/114 |
| 2011/0298422 A1* | 12/2011 | Failing | H02J 50/80 320/109 |
| 2011/0301795 A1* | 12/2011 | Failing | B60L 53/126 701/45 |
| 2011/0302078 A1* | 12/2011 | Failing | B60L 53/126 700/297 |
| 2011/0309798 A1* | 12/2011 | Hara | H01M 10/0525 429/211 |
| 2012/0001596 A1* | 1/2012 | Meyer | H02J 7/00306 320/125 |
| 2012/0136594 A1* | 5/2012 | Tang | H01M 10/48 324/427 |
| 2012/0212183 A1* | 8/2012 | Yamada | H02J 7/007 320/134 |
| 2012/0223677 A1* | 9/2012 | Yamauchi | H02J 7/34 320/134 |
| 2012/0256592 A1* | 10/2012 | Baughman | H01M 10/482 320/118 |
| 2013/0055553 A1* | 3/2013 | Zhang | H01M 10/48 29/593 |
| 2013/0057219 A1* | 3/2013 | Sakata | H02J 7/0048 320/118 |
| 2013/0113432 A1* | 5/2013 | Suzuki | H02J 7/0014 320/134 |
| 2013/0335012 A1* | 12/2013 | Meyer | H02J 7/0013 320/107 |
| 2013/0335036 A1* | 12/2013 | Zhang | H02J 7/0014 320/162 |
| 2014/0266221 A1* | 9/2014 | Baughman | G01R 31/3835 324/426 |
| 2014/0266222 A1* | 9/2014 | Baughman | H02J 7/0019 324/426 |
| 2015/0028814 A1* | 1/2015 | Johnson | H02J 7/00 320/134 |
| 2015/0340887 A1* | 11/2015 | Meyer | H02J 7/0045 320/112 |
| 2016/0022164 A1* | 1/2016 | Brockway | A61B 5/7203 600/509 |
| 2016/0025815 A1* | 1/2016 | Baughman | G01R 31/396 702/63 |
| 2016/0061909 A1* | 3/2016 | Iino | G01R 31/3835 324/432 |
| 2016/0124053 A1* | 5/2016 | Akaishi | G07C 5/0841 701/33.4 |
| 2016/0169978 A1* | 6/2016 | Fukuhara | G01R 31/392 324/434 |
| 2017/0108552 A1* | 4/2017 | Roumi | G01R 31/386 |
| 2017/0271886 A1* | 9/2017 | Park | H02J 7/00 |
| 2017/0343613 A1* | 11/2017 | Frost | G01R 31/367 |
| 2018/0034113 A1* | 2/2018 | Gibbs | H01M 10/0525 |
| 2018/0034289 A1* | 2/2018 | Meyer | H02J 7/0013 |
| 2018/0172772 A1* | 6/2018 | Yuan | G01R 31/389 |
| 2018/0309304 A1* | 10/2018 | Meyer | H02J 7/0036 |
| 2019/0036355 A1* | 1/2019 | Su | H02J 7/0048 |
| 2019/0072616 A1* | 3/2019 | Matsushita | G01R 31/374 |
| 2019/0077265 A1* | 3/2019 | Ono | H01M 10/482 |
| 2019/0356142 A1* | 11/2019 | Meyer | H02J 7/00038 |
| 2020/0025832 A1* | 1/2020 | Cho | G01R 31/392 |
| 2020/0041569 A1* | 2/2020 | Roumi | G01R 31/389 |
| 2020/0081069 A1* | 3/2020 | Chen | G01R 31/36 |
| 2020/0158786 A1* | 5/2020 | Gupta | G01R 31/3646 |
| 2020/0309857 A1* | 10/2020 | Zeyghami | H02J 7/0068 |
| 2020/0319259 A1* | 10/2020 | Pressman | G05B 19/042 |
| 2020/0343740 A1* | 10/2020 | Meyer | H02J 7/0048 |
| 2020/0361340 A1* | 11/2020 | Wang | H02J 7/007182 |

(56) References Cited

U.S. PATENT DOCUMENTS

| | | | | |
|---|---|---|---|---|
| 2020/0376968 A1* | 12/2020 | Wang | | B60L 50/66 |
| 2021/0016664 A1* | 1/2021 | Deng | | B60L 50/60 |
| 2021/0036643 A1* | 2/2021 | Wang | | B60L 58/19 |
| 2021/0043894 A1* | 2/2021 | Cornelli | | H01M 10/425 |
| 2021/0129706 A1* | 5/2021 | Wang | | B60R 16/0231 |
| 2021/0245622 A1* | 8/2021 | Wang | | H02J 7/0013 |
| 2021/0265674 A1* | 8/2021 | Doczy | | G01R 31/396 |
| 2021/0293889 A1* | 9/2021 | Roumi | | G01R 31/396 |
| 2021/0336450 A1* | 10/2021 | Meyer | | H02J 7/00309 |
| 2022/0024720 A1* | 1/2022 | Kondo | | B66B 5/021 |
| 2022/0043069 A1* | 2/2022 | Yoon | | G01R 31/392 |
| 2022/0069376 A1* | 3/2022 | Baughman | | H01M 10/482 |
| 2022/0140617 A1* | 5/2022 | Wang | | G01R 31/396 |
| | | | | 320/134 |
| 2022/0221527 A1* | 7/2022 | Yoon | | G01R 31/392 |
| 2022/0266695 A1* | 8/2022 | Pressman | | B60L 50/60 |
| 2023/0040212 A1* | 2/2023 | Wang | | H01M 10/482 |
| 2023/0055095 A1* | 2/2023 | Wang | | G01R 31/3835 |
| 2023/0077121 A1* | 3/2023 | Golubkov | | H01M 10/6568 |
| 2023/0131563 A1* | 4/2023 | Liu | | H01M 10/486 |
| | | | | 429/90 |
| 2023/0142690 A1* | 5/2023 | Muldoon | | G01R 31/3835 |
| | | | | 429/99 |
| 2023/0170727 A1* | 6/2023 | Taniguchi | | H01M 10/48 |
| | | | | 320/136 |
| 2023/0221375 A1* | 7/2023 | Wang | | H01M 10/48 |
| | | | | 320/136 |
| 2023/0268745 A1* | 8/2023 | Hao | | B60L 53/62 |
| | | | | 320/117 |
| 2023/0268860 A1* | 8/2023 | Hao | | H02P 23/14 |
| | | | | 318/472 |
| 2023/0303091 A1* | 9/2023 | You | | B60L 53/65 |
| 2023/0318066 A1* | 10/2023 | Williams | | H01M 10/425 |
| | | | | 429/53 |
| 2023/0324461 A1* | 10/2023 | Roumi | | G01R 31/52 |
| | | | | 324/430 |
| 2023/0341827 A1* | 10/2023 | Pedder | | G05B 13/041 |
| 2023/0366935 A1* | 11/2023 | Lee | | G01R 31/396 |
| 2023/0366943 A1* | 11/2023 | Wang | | G01R 31/367 |
| 2024/0057923 A1* | 2/2024 | Jose | | A61B 5/346 |
| 2024/0063387 A1* | 2/2024 | Yamazaki | | H01M 50/109 |
| 2024/0085490 A1* | 3/2024 | Wang | | G01R 31/3648 |
| 2024/0094308 A1* | 3/2024 | Yoshida | | G01R 31/388 |
| 2024/0110993 A1* | 4/2024 | Wang | | G01R 31/389 |
| 2024/0136605 A1* | 4/2024 | Haskara | | H01M 10/443 |
| 2024/0157832 A1* | 5/2024 | Hao | | B60L 53/16 |

FOREIGN PATENT DOCUMENTS

| | | | | | |
|---|---|---|---|---|---|
| CN | 108107364 A | * | 6/2018 | | G01R 31/3648 |
| CN | 106802396 B | * | 4/2019 | | G01R 31/367 |
| CN | 110161414 A | * | 8/2019 | | |
| CN | 110764015 A | | 2/2020 | | |
| CN | 110943261 A | | 3/2020 | | |
| CN | 111413629 A | | 7/2020 | | |

* cited by examiner

THERMAL RUNAWAY PROGNOSIS BY DETECTING ABNORMAL CELL VOLTAGE AND SOC DEGENERATION

INTRODUCTION

The subject disclosure relates to a system and method for monitoring an occurrence of thermal runaway in a battery pack and, in particular, to a system and method for predicting an onset of thermal runaway in order to allow for preventative action to be taken.

Electric vehicles operate using battery packs employing a plurality of battery cells. These battery cells can self-discharge if an internal short circuit occurs in the battery cell. The current in the short circuit can cause the temperature of the battery cell to increase, which may in turn reduce internal short resistance, allowing for an increase in the current of the short circuit. This feedback loop can lead to an out-of-control heating situation, known as thermal runaway or TRA. If left unchecked, thermal runaway can lead to a battery failure. Accordingly, it is desirable to provide prognostic capabilities to be able to predict an on-coming occurrence of thermal runaway in order to take preventative action before damage is done to the battery pack as well as to the electric vehicle.

SUMMARY

In one exemplary embodiment, a method of monitoring an occurrence of thermal runaway in a battery pack is disclosed. A plurality of voltage measurements is obtained at each of a plurality of battery cells of the battery pack. A mean value is determined based on the plurality of voltage measurements. A voltage measurement obtained from a selected battery cell is compared to the mean value. A notification signal is generated when a difference between the voltage measurement from the selected battery cell and the mean value is greater than or equal to a prognostic threshold.

In addition to one or more of the features described herein, the prognostic threshold is a multiple of a standard deviation of the plurality of voltage measurements. The method further includes determining a voltage parameter from a voltage measurement, wherein the voltage parameter is one of a voltage of the selected battery cell, a voltage residual of the selected battery cell, a state of charge of the selected battery cell, a rate of change of voltage over time of the selected battery cell, and a rate of change of a state of charge over time of the selected battery cell. The method further includes obtaining the plurality of voltage measurements and the voltage measurement from the selected battery cell at a same time step. The method further includes comparing a rate of change of voltage over a time window for the selected battery cell to the prognostic threshold and the prognostic threshold is based on a mean voltage of the battery pack over the time window and a capacity of the battery pack. The method further includes determining a resistance of a short within the selected battery cell from a change in a deviation of a state of charge of the selected battery cell from the mean value over time, wherein the change in the deviation is determined using a cell balancing correction. The method further includes correcting a voltage for a natural discharge of the selected battery cell due to cell balancing.

In another exemplary embodiment, a system for monitoring an occurrence of thermal runaway in a battery pack of a vehicle is disclosed. The system includes a plurality of voltage sensors and a processor. The plurality of voltage sensors obtains a plurality of voltage measurements at each of a plurality of battery cells of the battery pack. The processor is configured to determine a mean value based on the plurality of voltage measurements, compare a voltage measurement obtained from a selected battery cell to the mean value, and generate a notification signal when a difference between the voltage measurement from the selected battery cell and the mean value is greater than or equal to a prognostic threshold.

In addition to one or more of the features described herein, the prognostic threshold is a multiple of a standard deviation of the plurality of voltage measurements. The processor is further configured to determine a voltage parameter from a voltage measurement, wherein the voltage parameter is one of a voltage of the selected battery cell, a voltage residual of the selected battery cell, a state of charge of the selected battery cell, a rate of change of voltage over time of the selected battery cell, and a rate of change of a state of charge over time of the selected battery cell. The system of claim 8, wherein the plurality of voltage sensors is further configured to obtain the plurality of voltage measurements and the voltage measurement from the selected battery cell at a same time step. The processor is further configured to compare a rate of change of voltage over a time window for the selected battery cell to the prognostic threshold and the prognostic threshold is based on a mean voltage of the battery pack over the time window and a capacity of the battery pack. The processor is further configured to determine a resistance of the selected battery cell from a change in a deviation of a state of charge of the selected battery cell from the mean value over time, wherein the change in the deviation is determined using a cell balancing correction. The processor is further configured to correct a voltage for a natural discharge of the selected battery cell due to cell balancing.

In yet another exemplary embodiment, a vehicle is disclosed. The vehicle includes a battery pack, a plurality of voltage sensors, and a processor. The battery pack includes a plurality of battery cells. The plurality of voltage sensors obtains a plurality of voltage measurements at each of the plurality of battery cells. The processor is configured to determine a mean value based on the plurality of voltage measurements, compare a voltage measurement obtained from a selected battery cell to the mean value, and generate a notification signal when a difference between the voltage measurement from the selected battery cell and the mean value is greater than or equal to a prognostic threshold.

In addition to one or more of the features described herein, the prognostic threshold is a multiple of a standard deviation of the plurality of voltage measurements. The processor is further configured to determine a voltage parameter from a voltage measurement, wherein the voltage parameter is one of a voltage of the selected battery cell, a voltage residual of the selected battery cell, a state of charge of the selected battery cell, a rate of change of voltage over time of the selected battery cell, and a rate of change of a state of charge over time of the selected battery cell. The plurality of voltage sensors is further configured to obtain the plurality of voltage measurements and the voltage measurement from the selected battery cell at a same time step. The processor is further configured to compare a rate of change of voltage over a time window for the selected battery cell to the prognostic threshold and the prognostic threshold is based on the mean voltage of the battery pack over the time window and a capacity of the battery pack. The processor is further configured to determine a resistance of the battery cell from a change in a deviation of a state of charge of the selected battery cell from the mean value over time, wherein the change in the deviation is determined using a cell balancing correction.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
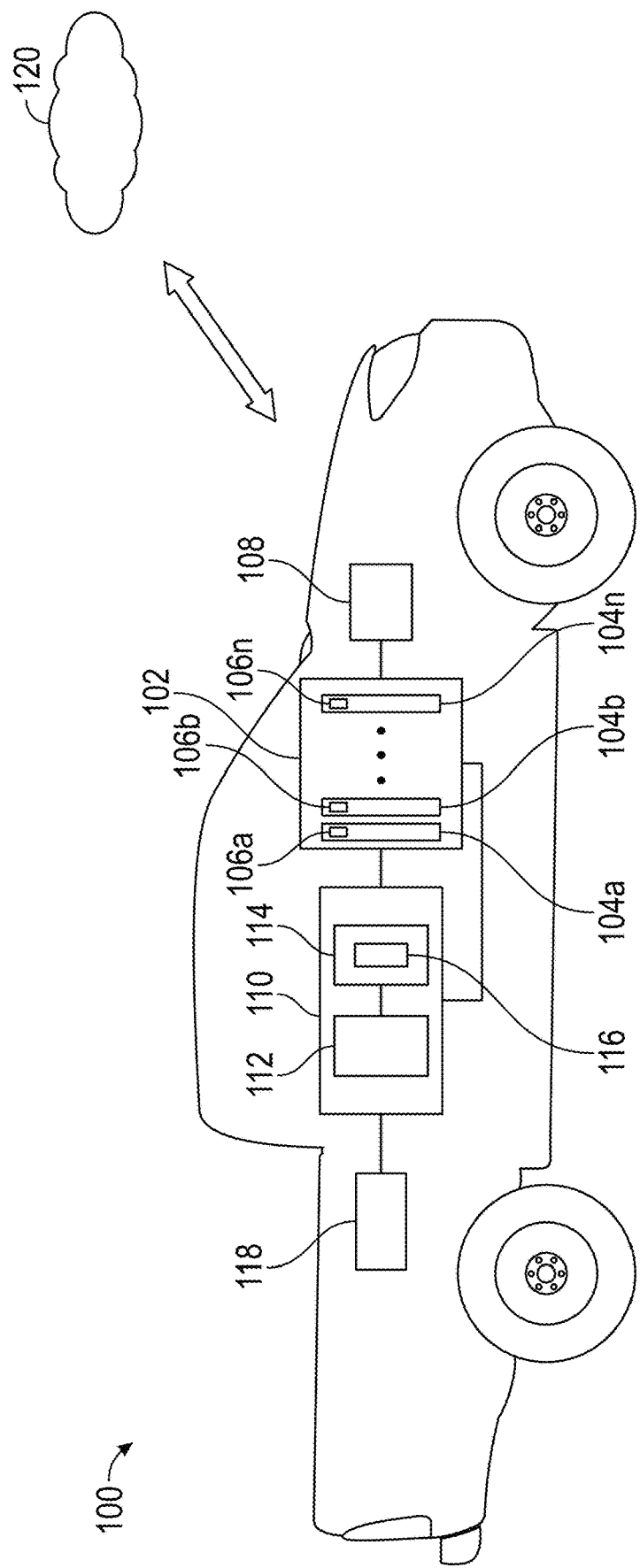
FIG. 1 shows an electric vehicle in an illustrative embodiment.

The following description is merely exemplary in nature and is not intended to limit the present disclosure, its application or uses. It should be understood that throughout the drawings, corresponding reference numerals indicate like or corresponding parts and features.

In accordance with an exemplary embodiment, FIG. 1 shows an electric vehicle 100. The electric vehicle 100 includes a battery pack 102, an electrical load 108 which operates using electricity supplied by the battery pack, and a control system 110 that monitors the battery pack. The battery pack 102 includes a plurality of battery cells 104a, . . . , 104n. A plurality of voltage sensors 106a, . . . , 106n obtain voltage measurements from the plurality of battery cells 104a, . . . , 104n, respectively, and transmit the voltage measurements to the control system 110.

The electrical load 108 can include a motor of the electric vehicle 100 and/or other electrical components, such as dashboard lights, exterior lights, entertainment systems, etc. The control system 110 includes a processor 112 and a memory storage device 114 having various programs or instructions 116 stored therein. The processor 112 can access and the programs or instructions from the memory storage device 114 and run the programs or instructions to perform the various operations disclosed herein for predicting an onset of thermal runaway (TRA) and generate an appropriate alarm or take an appropriate action.

The control system 110 is in communication with an alarm notification unit 118 and can notify the alarm notification unit when a thermal runaway event is predicted based on the calculations disclosed herein. In an embodiment, the alarm notification unit 118 can transmit a notification signal to a remote server 120 such as OnStar®. The remote server 120 can respond to the notification signal by alerting local emergency units such as firefighters. In other embodiments, the alarm notification unit 118 can provide a visual signal to a driver of the vehicle or sound an alarm. In various embodiments, rather than generating an alarm, data can be sent to the remote server 120 at a later time for processing and review.

Figure 2:
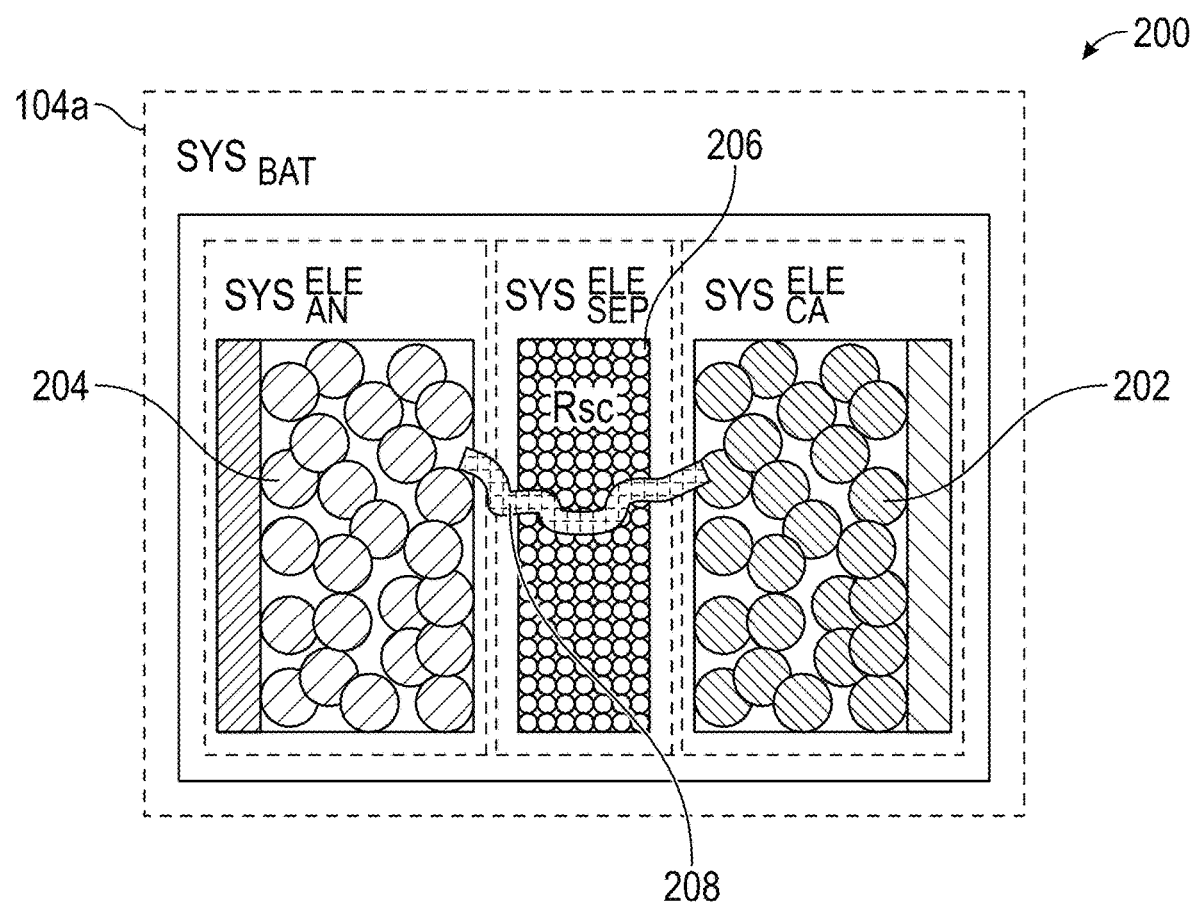
FIG. 2 shows a schematic diagram of a battery cell of the electric vehicle.

FIG. 2 shows a schematic diagram 200 of a battery cell (e.g., battery cell 104a). The battery cell 104a includes a cathode 202, an anode 204 and an insulating medium 206 separating the cathode from the anode. The insulating medium 206 prevents a current from flowing between the cathode 202 and the anode 204. The schematic diagram 200 also shows a short circuit 208 through the insulating medium 206 that can occur due to degradation of the insulating medium or through excessive use of the battery cell 104a.

Figure 3:
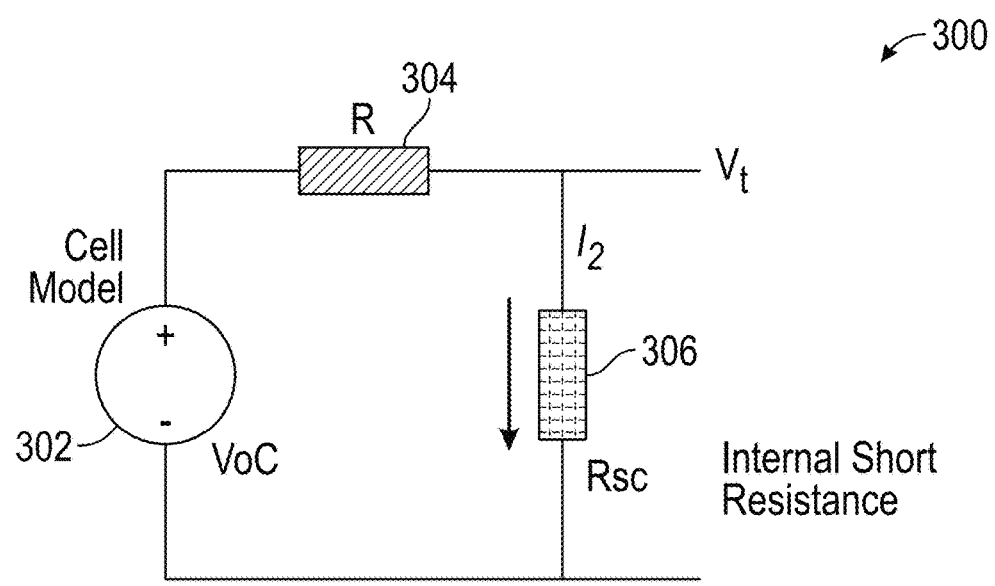
FIG. 3 shows a circuit diagram representing the battery cell in a short circuit scenario.

FIG. 3 shows a circuit diagram 300 representing the battery cell 104a in a short circuit scenario. The circuit diagram 300 includes a voltage source 302, an internal resistance R 304 of the battery cell, and an internal short resistance $R_{SC}$ 306 due to an internal short circuit. The battery terminal voltage Vt for the circuit diagram 300 is given in Eq. (1):

$$V_t = \frac{R_{SC}}{R_{SC} + R} V_{OC}(SOC(k)) \qquad \text{Eq. (1)}$$

where Voc is an open circuit voltage of the battery. The Voc is dependent on a state of charge (SOC) of the battery at a given time step k. The change in the state of charge at given time is given in Eq. (2):

$$SOC(k+1) = SOC(k) - \left(\frac{V_t(k)dt}{R_{SC}}\right)/Cap \qquad \text{Eq. (2)}$$

Where SOC(k+1) is the state of charge at the $(k+1)^{th}$ time step, SOC(k) is the state of charge at the $k^{th}$ time step. Cap is a cell capacity of the battery cell and dt is a sample time interval between the $k^{th}$ time step and the $(k+1)^{th}$ time step. Eq. (2) can be rearranged to solve for internal short resistance, as shown in Eq. (3):

$$R_{SC} = \frac{V_t(k)dt}{[s(k+1) - s(k)]Cap} \qquad \text{Eq. (3)}$$

Figure 4:
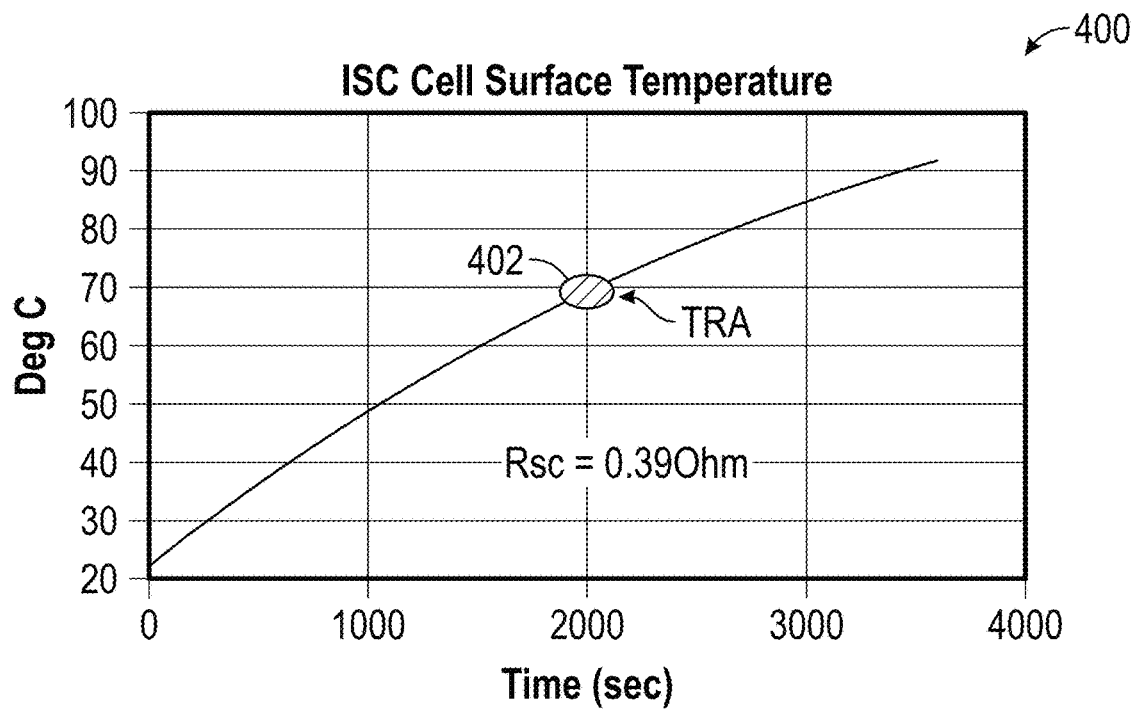
FIG. 4 shows an illustrative graph of a relation between a battery cell temperature and time for a battery cell having an internal short circuit.

FIG. 4 shows a graph 400 of a relation between battery cell temperature and time in an illustrative embodiment for a battery cell having an internal short circuit. Time is shown in seconds along the abscissa and temperature is shown in Celsius along the ordinate axis. The internal short resistance is $R_{SC}$=0.39Ω. A heat transfer equation for the battery cell is given in Eq. (4):

$$M_b C_{pb} \frac{dT_b}{dt} = -hA(T_b - T_c) - hA_1(T_b - T_i) + \frac{V_t^2}{R_{SC}} \qquad \text{Eq. (4)}$$

where $M_b$ is the battery cell mass, $C_{pb}$ is a heat coefficient, $T_b$ is a temperature of the battery cell, $T_c$ is a coolant temperature, $T_i$ is temperature of an adjacent battery cell, and hA is a heat convention coefficient or heat conduction coefficient. When in use, the temperature of the battery cell rises over time. Point 402 indicates a temperature at which thermal runaway occurs.

Figure 5:
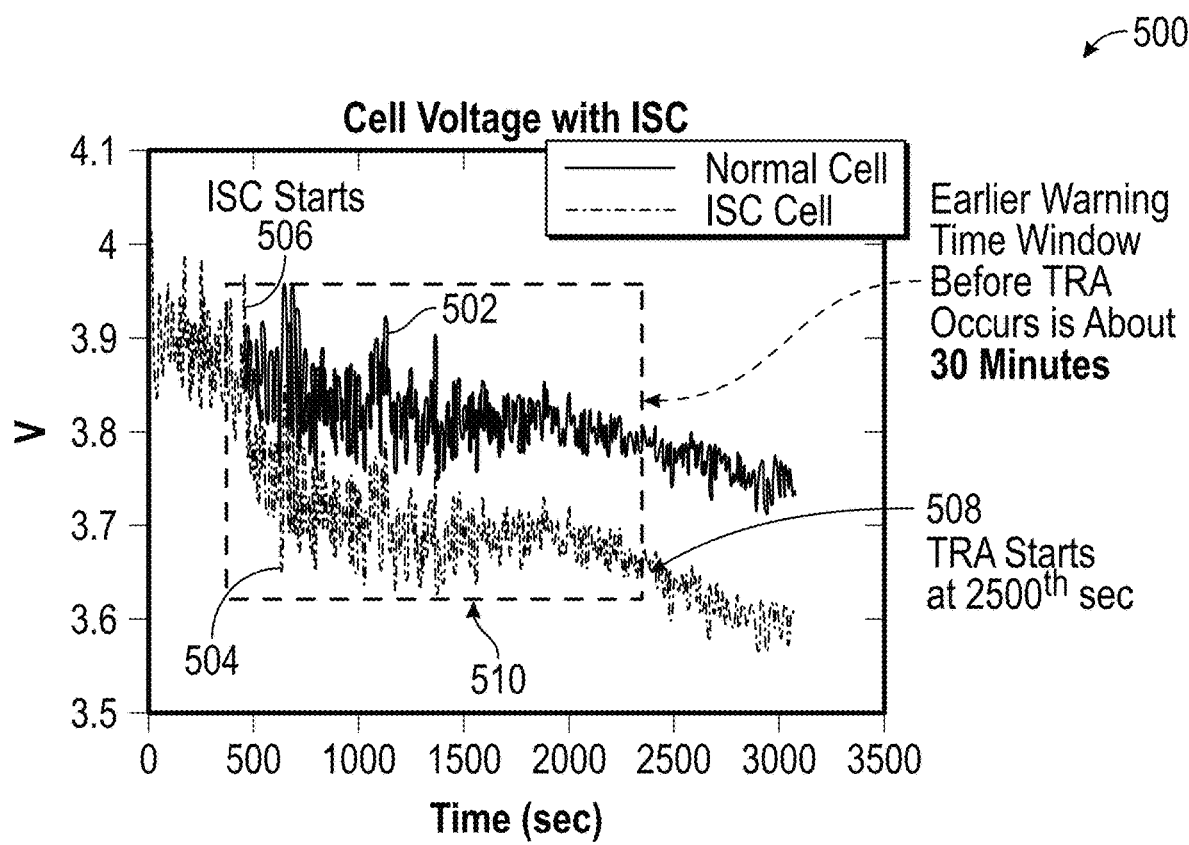
FIG. 5 shows an illustrative graph showing an evolution of a battery cell voltage over time.

FIG. 5 shows graph 500 illustrating an evolution of a battery cell voltage over time, in an illustrative embodiment. Time is shown in seconds along the abscissa and voltage is shown along the ordinate axis. A first curve 502 shows a voltage for a normal battery cell. A second curve 504 shows a voltage for a battery cell having an internal short circuit. As time progresses, the voltage of the battery cell having the internal short circuit (i.e., second curve 504) deviates from the voltage of the normal battery cell (i.e., first curve 502). Graph 500 shows a fault time 506 at which the internal short circuit occurs and a TRA time 508 at which TRA occurs due to the internal short circuit at fault time 506. A time window 510 marks a time interval over which voltages can be measured to predict the onset of the TRA.

Figure 6:
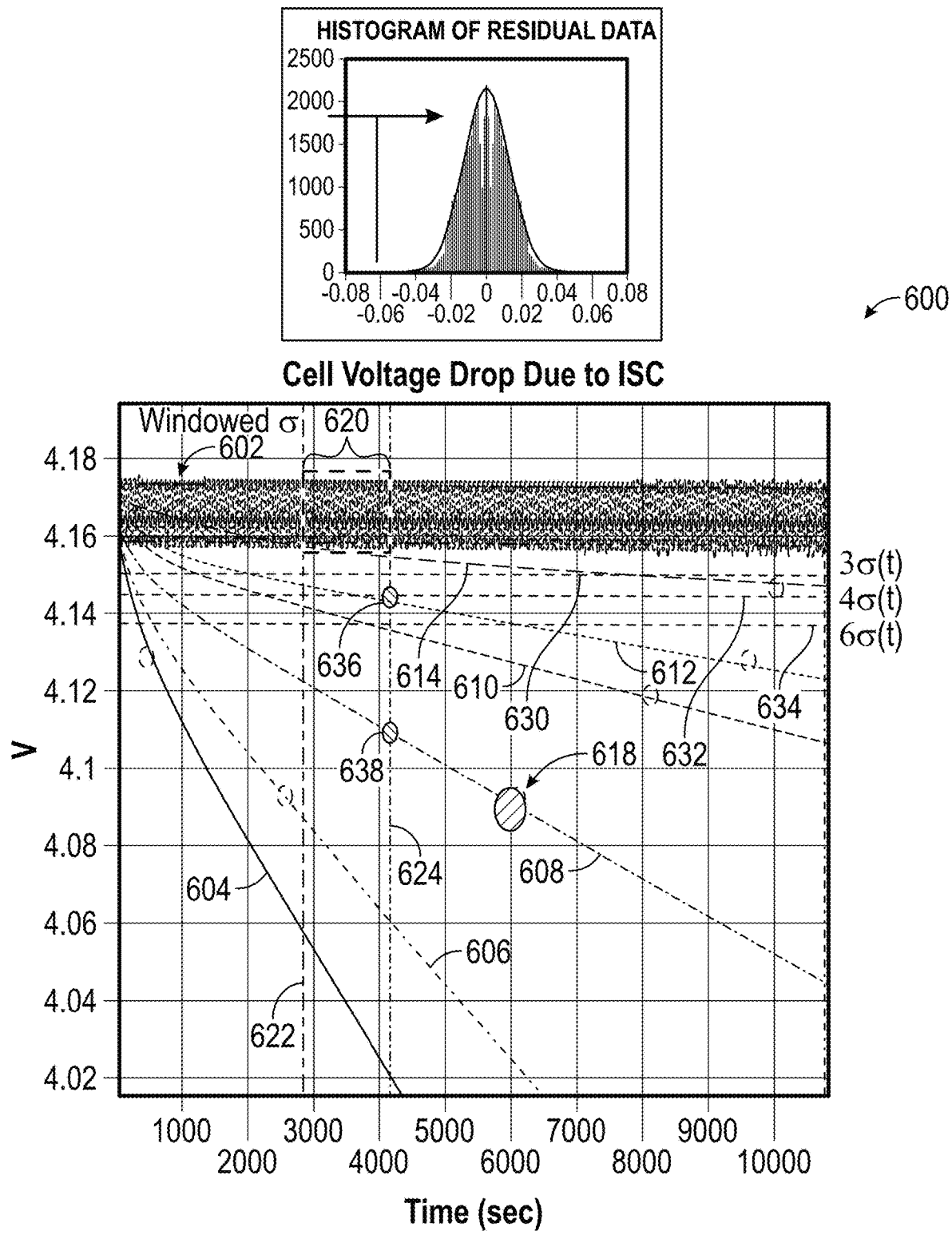
FIG. 6 shows a graph illustrating a method for detecting the internal short circuit and then predicting thermal runaway by measuring battery cell voltages.

FIG. 6 shows a graph 600 illustrating a method for detecting the internal short circuit and then predict thermal runaway by measuring battery cell voltages. Time is shown in seconds along the abscissa and voltage is shown along the ordinate axis. The graph 600 includes a group 602 of voltages from normal battery cells of the battery pack. Graph 600 also shows voltages for a battery cell having various internal short resistances $R_{SC}$. Voltage curve 604 corresponds to Rsc=0.3Ω. Voltage curve 606 corresponds to Rsc=0.43Ω. Voltage curve 608 corresponds to Rsc=0.88Ω. Voltage curve 610 corresponds to Rsc=2Ω. Voltage curve 612 corresponds to Rsc=7Ω. Voltage curve 614 corresponds to Rsc=15Ω. Point 618 indicates a time at which thermal runaway occurs on voltage curve 608.

A time window 620 is used to determine the presence of an internal short circuit. The time window 620 can be a moving time window and includes a trailing time edge 622 and a current time edge 624, which are maintained at a selected time duration from each other. In one embodiment, calculations are performed using measurements obtained at the current time edge 624.

Voltage measurements of each of 'n' cells in a battery pack are obtained at current time edge 624. A mean value, or mean voltage, is determined from the voltages. A plurality of prognostic thresholds that are established based on the mean voltage and a standard deviation about the mean voltage. In various embodiments, the prognostic thresholds are spaced from the mean value by an integral multiple of the standard deviation. However, this is not a necessary limitation of the invention. For illustrative purposes, a first prognostic threshold 630 is located at 3σ away from the mean value, a second prognostic threshold 632 is located at 4σ away from the mean value, and a third prognostic threshold 634 is located at 6σ away from the mean value. The plurality of prognostic thresholds is used to test for a condition leading to thermal runaway. Each battery cell voltage is tested against the prognostic thresholds. If one of the battery cell voltages is outside of the mean voltage by an amount greater than the plurality of prognostic thresholds, an alarm is generated.

As an example, voltage curve 612 is between the second prognostic threshold 632 and the third prognostic threshold 634 at the current time edge as shown by point 636. No alarm is generated for this situation. In another example, voltage curve 608 is outside of the third prognostic threshold 634 at the current time edge as shown by point 638 and thus an alarm is generated.

In one embodiment, the mean voltage is determined using only voltage measurements obtained at the current time edge 624. In another embodiment, the mean voltage and standard deviation σ are determined using voltage measurements obtained during the time window 620 (i.e., between the trailing time edge 622 and the current time edge 624) in order to provide a more rigorous mean voltage.

Figure 7:
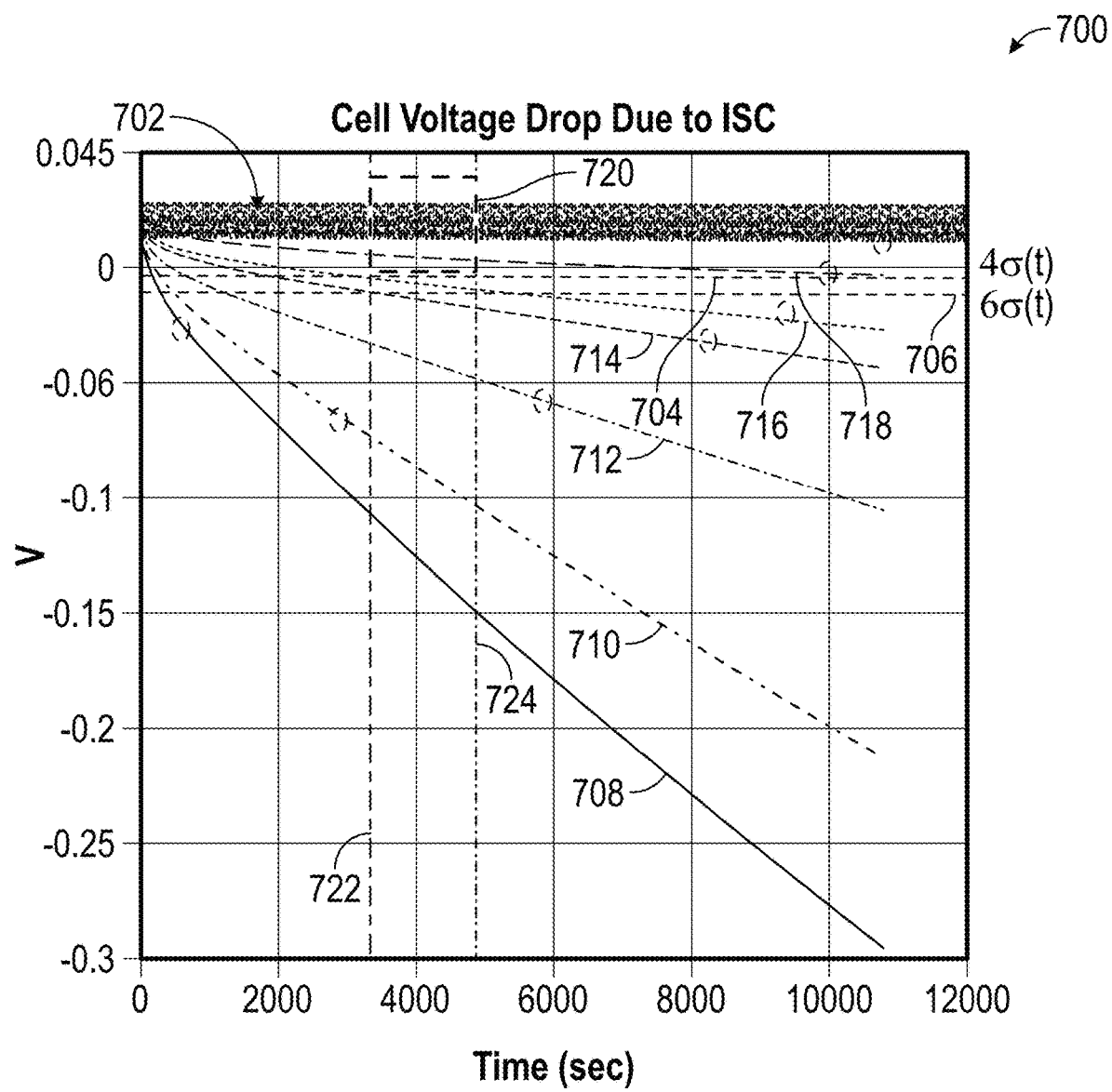
FIG. 7 shows a graph illustrating a method for detecting internal short circuit and associated thermal runaway scenarios from a residual of battery cell voltages.

FIG. 7 shows a graph 700 illustrating a method for detecting internal short circuit and associated thermal runaway scenarios from a residual of battery cell voltages. Time is shown along the abscissa in seconds and residual value is shown along the ordinate axis.

A residual for the $j^{th}$ battery cell at an $i^{th}$ time step is a given by a difference between the battery cell voltage and the mean value of voltage for the group of battery cells in the battery module or battery pack at the $i^{th}$ time step, as shown in Eq. (5):

$$r_j(i) = V_j(i) - V_{mean}(i) \qquad \text{Eq. (5)}$$

where j=1, . . . , n, and 'n' is the number of battery cells in the battery module or the battery pack. Graph 700 includes a residual group 702 for residuals of normal battery cells of the battery pack. A mean value, or mean residual, is derived from the residuals of the n battery cells. Graph 700 also shows residuals for battery cells having various internal short resistances $R_{SC}$. Residual curve 708 corresponds to Rsc=0.3 ohms. Residual curve 710 corresponds to Rsc=0.43 ohms. Residual curve 712 corresponds to Rsc=0.88 ohms. Residual curve 714 corresponds to Rsc=2 ohms. Residual curve 716 corresponds to Rsc=7 ohms. Residual curve 718 corresponds to Rsc=15 ohms.

Time window 720 shows a time interval over at which measurement can be obtained to perform calculations for predicting an onset of TRA. Time window 720 includes a trailing time edge 722 and a current time edge 724. Calculations using the residuals are the same as described in FIG. 6 with respect to battery cell voltages.

Prognostic thresholds in FIG. 7 are shown that are integral multiples of a standard deviation of the mean residual. The plurality of prognostic thresholds IS used to test for a condition leading to thermal runaway. The prognostic thresholds that are established based on the mean residual and a standard deviation about the mean residual. In various embodiments, the prognostic thresholds are spaced from the mean residual by an integral multiple of the standard deviation. However, this is not a necessary limitation of the invention. For illustrative purposes, first residual prognostic threshold 704 is located at 4σ and second residual prognostic threshold 706 is located at 6σ. The residual of each battery cell is tested against the prognostic threshold. If one of the residuals is outside of the mean voltage by an amount greater than the prognostic thresholds, an alarm is generated.

Figure 8:
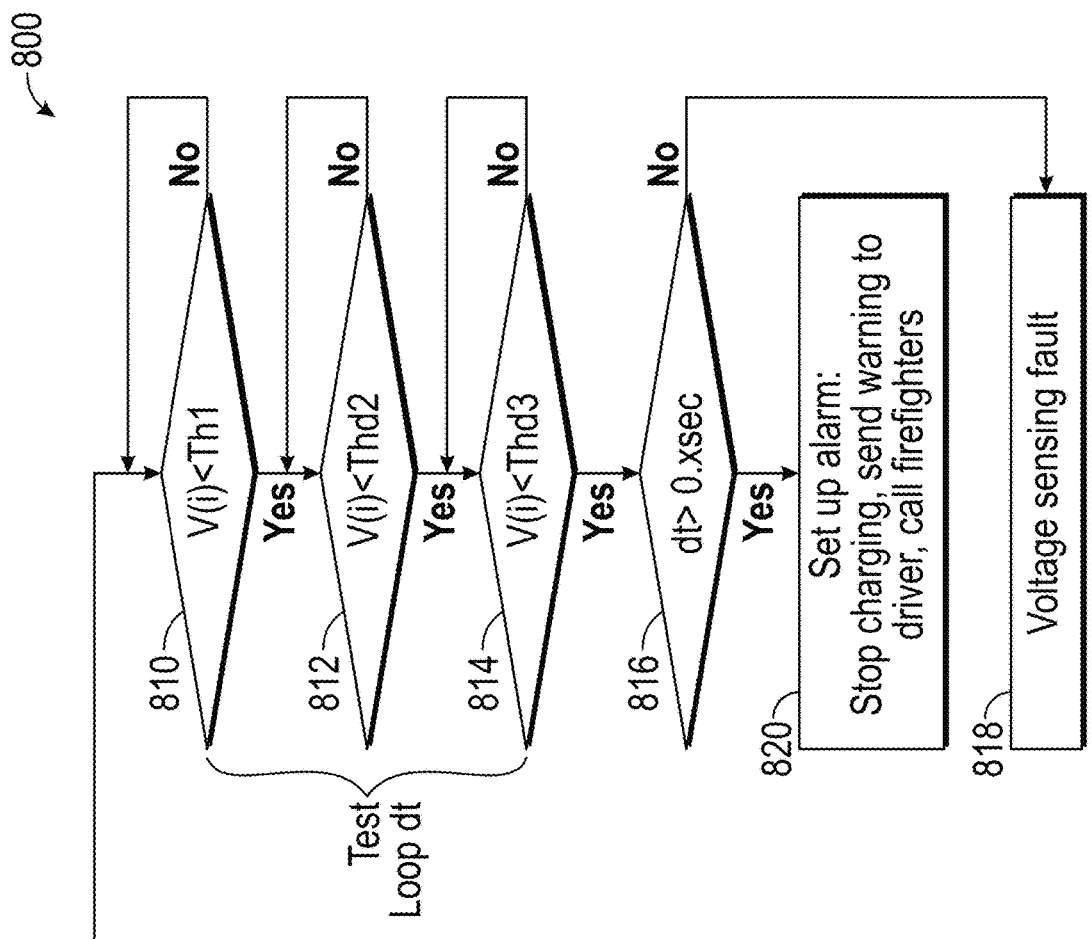
FIG. 8 shows a flowchart of a method for predicting the thermal runaway condition shown in FIGS. 6 and 7.
Figure 8:
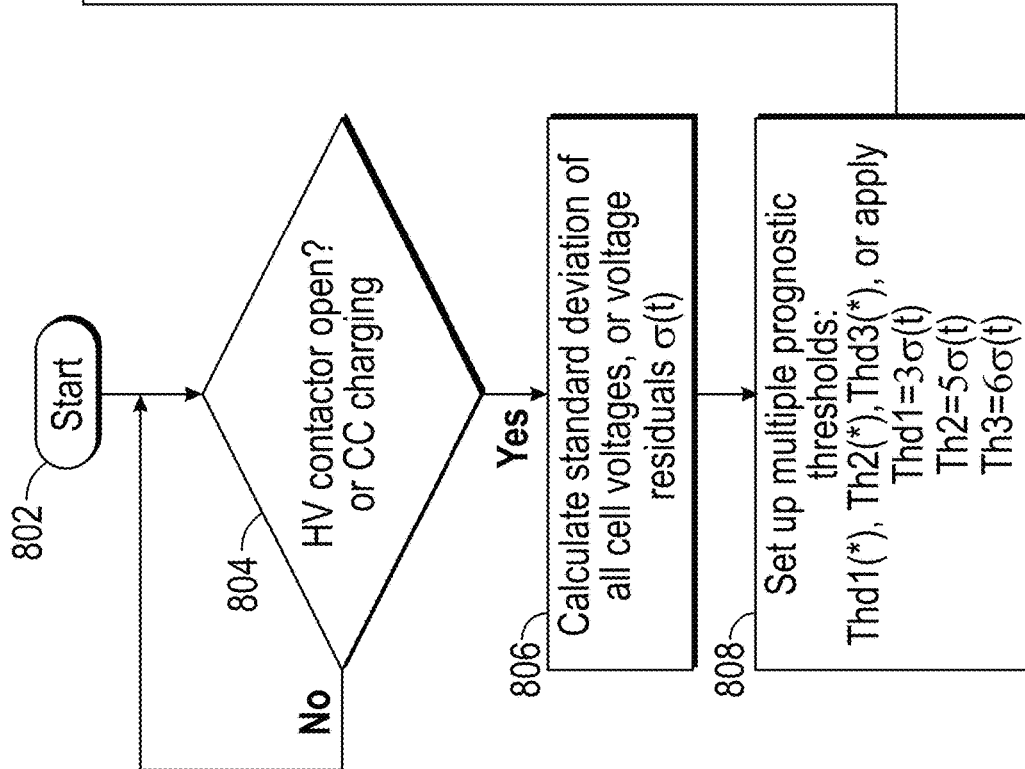

FIG. 8 shows a flowchart 800 of a method for predicting a thermal runaway condition, as shown in FIGS. 6 and 7. The method begins at box 802. At box 804, the method tests for whether a high voltage contact is open or if constant current charging of the battery is occurring. If these conditions are not present, then the method loops back to box 802. If either condition is present, the method proceeds to box 806. In box 806, a mean value and standard deviation is calculated based on voltage measurements obtained from the battery pack. The mean value and standard deviation are based on measurements obtained at the current time edge of the time window. In box 808, prognostic thresholds are set up based on the standard deviation. For illustrative purposes, three prognostic thresholds are established. Each cell voltage or residual is tested against the prognostic thresholds established in box 808 to determine if a TRA conditions is present.

Boxes 810, 812 and 814 provide a test loop for the cell voltages or residuals. In box 810, the cell voltage or residual is compared with the first prognostic threshold. If the voltage or residual is less than or equal to the first prognostic threshold, then the method loops back to box 810. If the cell voltage or residual is greater than the first prognostic threshold, then the method continues to box 812. In box 812, the cell voltage or residual is compared with the second prognostic threshold. If the voltage or residual is less than or equal to the second prognostic threshold, then the method loops back to box 812. If the cell voltage or residual is greater than the second prognostic threshold, then the method continues to box 814. In box 814, the cell voltage or residual is compared with the third prognostic threshold. If the voltage or residual is less than or equal to the third prognostic threshold, then the method loops back to box 814. If the cell voltage or residual is greater than the third prognostic threshold, then the method continues to box 816. As the cell voltages or residuals are being tested in boxes 810, 812 and 814, a loop time dt is measured to determine how long the cell voltage takes to pass through the prognostic thresholds.

In box 816, a test is performed to determine the validity of the test loop. If the loop time dt is less than or equal to a selected time threshold, then the method proceeds to box 818 in which it is determined that the prognostic test is invalid. The selected time threshold can be a predetermined fraction of a second, in various embodiments. If, in box 816, the loop time dt is greater than the selected time threshold, the method proceeds to box 820. In box 820, an alarm is generated, and the charging process is stopped if the battery is being charged.

Figure 9:
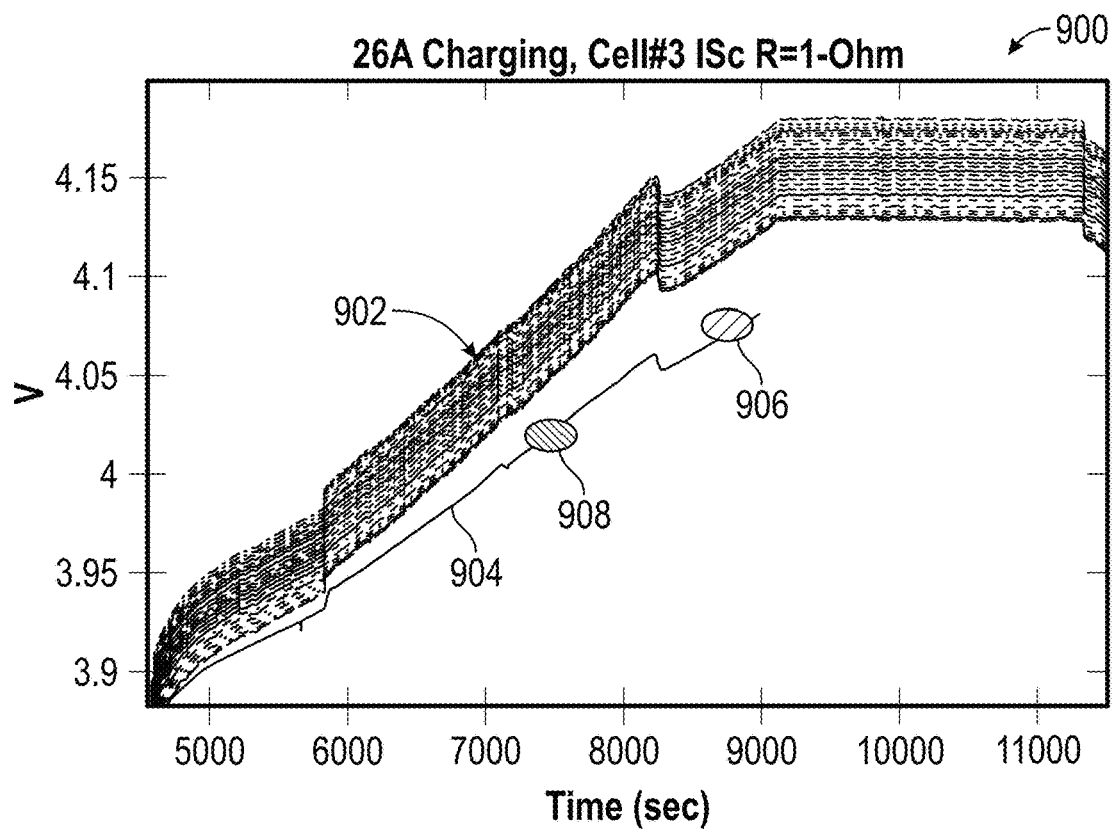
FIG. 9 shows an illustrative charging graph for a battery pack.

FIG. 9 shows an illustrative charging graph 900 for a battery pack. Time is shown in seconds along the abscissa and voltage is shown along the ordinate axis. A group curve 902 shows charging voltages for a plurality of normal battery cells of the battery pack. Curve 904 shows a charging voltage for a battery cell having an internal short resistance. Point 906 indicates a time at which thermal runaway occurs. Point 908 indicates a time at which an alarm can be generated using the methods disclosed herein. The alarm can clearly be generated well ahead of the thermal runaway, allowing sufficient time to take preventive action. In the illustrative charging graph 900, the warning is provided about 1500 seconds (about 25 minutes) before the thermal runaway.

Figure 10:
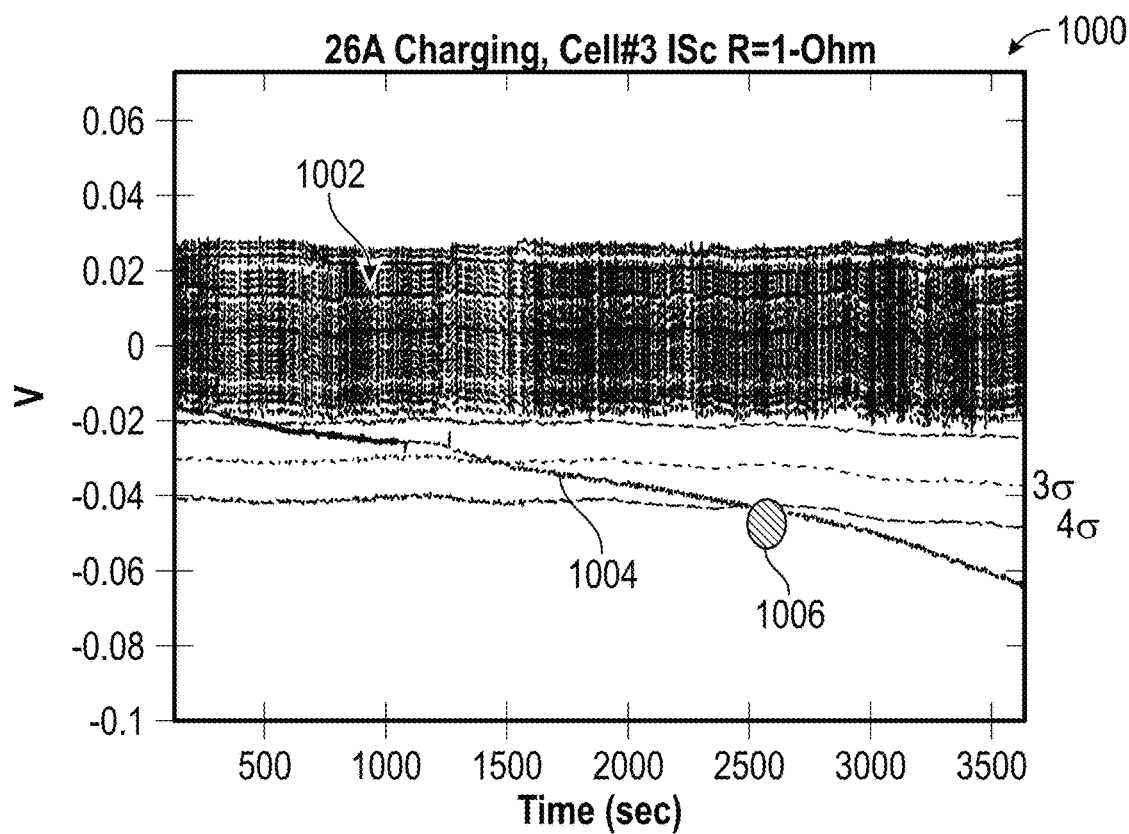
FIG. 10 shows a graph illustrating a condition in which an alarm or notification signal can be generated.

FIG. 10 shows a graph 1000 illustrating a condition in which an alarm or notification signal can be generated. Time is shown in seconds along the abscissa and voltage is shown along the ordinate axis. Group curve 1002 shows the charging voltage residuals for a plurality of normal battery cells of the battery pack over time. Curve 1004 is shown for battery cell that is approaching thermal runaway. The curve 1004 crosses the outermost prognostic threshold 1006 at about 2400 seconds to generate the alarm.

Figure 11:
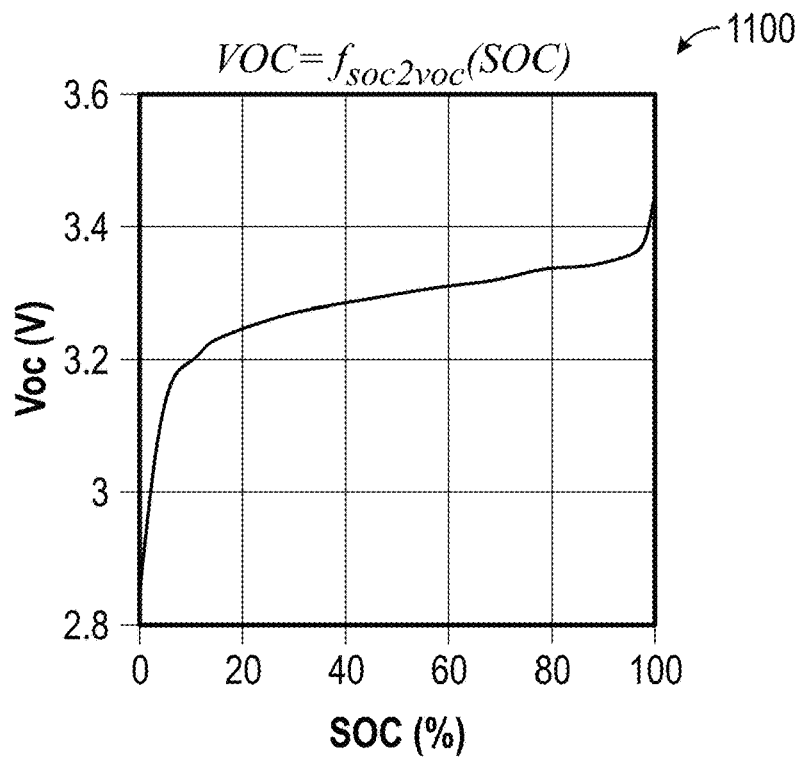
FIG. 11 is a graph depicting an open circuit voltage of a battery cell as a function of a state of charge of the battery cell.
Figure 12:
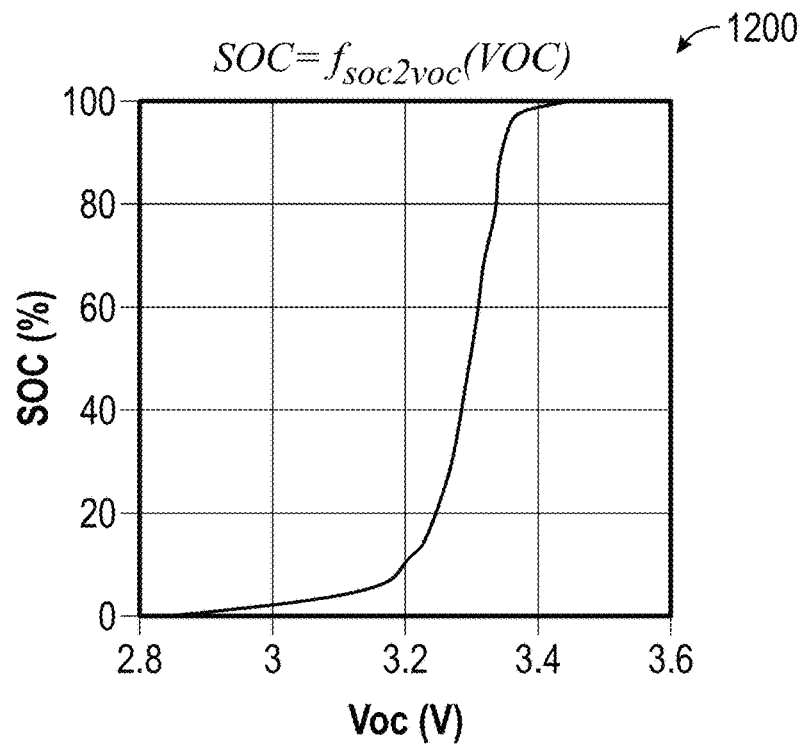
FIG. 12 is a graph depicting a state of charge of a battery cell as a function of an open circuit voltage of the battery cell.

FIG. 11 is a graph 1100 depicting an open circuit voltage $V_{OC}$ of a battery cell as a function of a state of charge SOC of the battery cell. The curve of the graph 1100 represents a function $f_{soc2voc}$ for converting from a state of charge to a voltage measurement. FIG. 12 is a graph 1200 depicting a state of charge SOC of a battery cell as a function of an open circuit voltage $V_{OC}$ of the battery cell. The curve of the graph 1200 represents a function $f_{voc2soc}$ for converting from a voltage measurement to a state of charge. The curves of FIGS. 11 and 12 are determined by battery chemistry.

Figure 13:
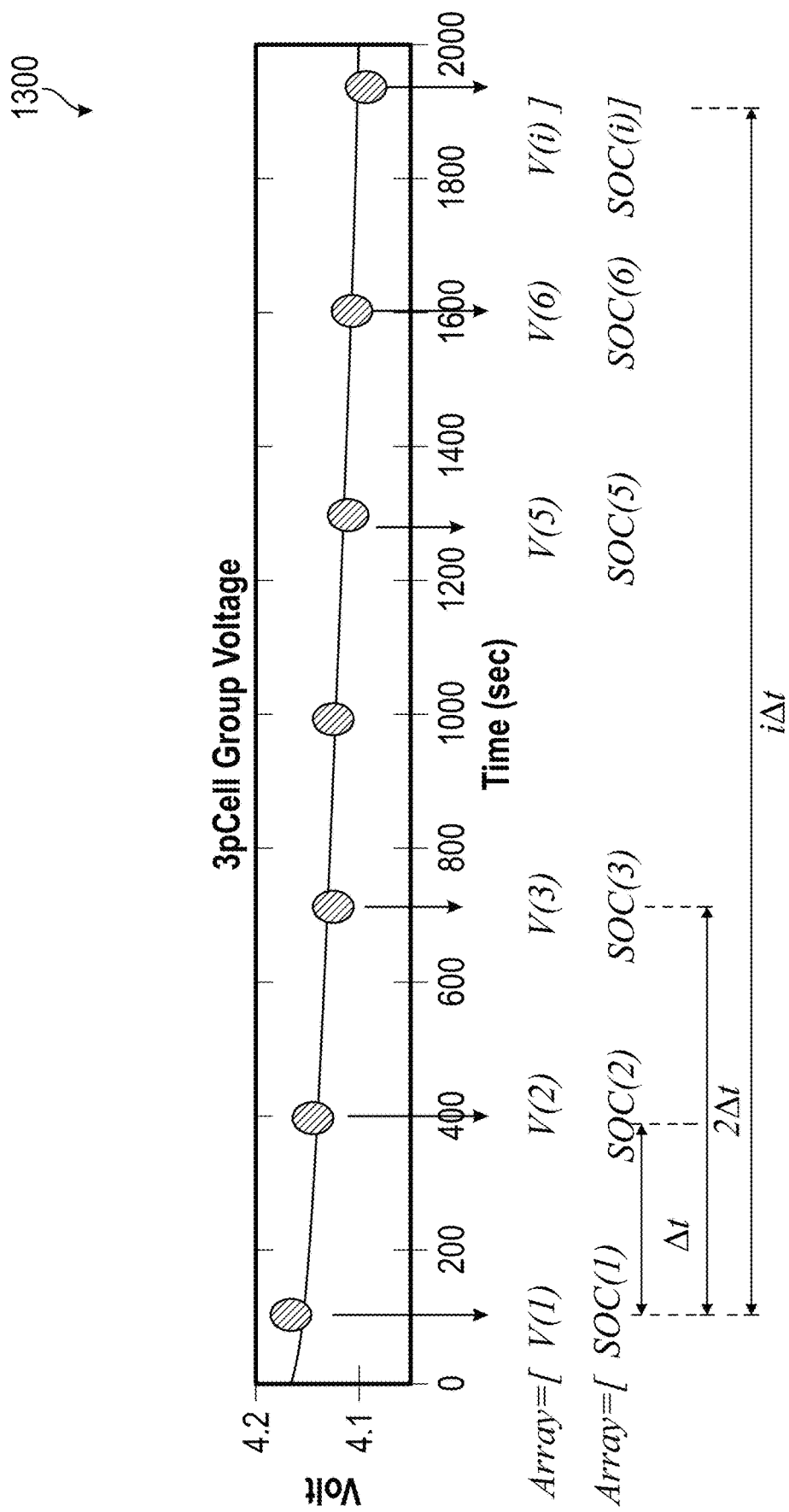
FIG. 13 shows a graph illustrating a second method for measuring a drop in voltage in a battery cell.

FIG. 13 shows a graph 1300 illustrating a second method for measuring a drop in voltage in a battery cell. The second method uses voltage measurements at two different time steps obtained over a time interval and determines the TRA by comparing the change in voltage over the time interval to one or more prognostic thresholds. The prognostic thresholds are based in part on a mean value of the voltage measurements over time Graph 1300 shows the measurement of a voltage of a $j^{th}$ battery cell of the battery pack. Voltage measurements are obtained at periodic intervals as indicated by V(1), V(2), V(3), ... V(i), where V(i) is the $i^{th}$ measurement. The base time interval separating two time-adjacent voltage measurements is time interval $\Delta T$. Thus, the voltage V(i) obtained at the $i^{th}$ time step is separated by $i\Delta T$ from the first voltage V(1) obtained at the first time step Once the measurements have been obtained, the voltages are corrected for natural discharge if battery cell balancing is on-going within the battery. For a voltage measurement V(i), a corresponding state of charge SOC(i) is determined using the function represented in FIG. 12. The effects of natural cell discharge are then removed from the SOC(i) by the step shown in Eq (6):

$$SOC(i) \rightarrow SOC(i) + Ah(i)/Cap \qquad \text{Eq. (6)}$$

Where Ah(i) is the balanced amp-hours (Ah) from natural discharge and Cap is the cell capacity. A corrected voltage is then determined from the corrected SOC using the function represented in FIG. 11. The change in cell voltage over time window $i*\Delta T$ is calculated, as shown in Eq. (7):

$$dV(i)=V(i+1)-V(1) \qquad \text{Eq. (7)}$$

For example, dV(1)=V(2)−V(1) and dV(3)=V(3)−V(1)

In one embodiment, a mean value $dV_m(i)$ can be determined using voltages from the plurality of battery cells in a module or in a battery pack. If the mean value $dV_m(i)$ is significant or greater than a selected threshold, it can be subtracted from each of the voltage measurements prior to determining the rate of change between time intervals.

In order to monitor a battery cell for an internal short, the rate of voltage drop $dV_j(i)$ for the $j^{th}$ cell at the $i^{th}$ time step is tested against a prognostic threshold Thr shown in Eq. (8):

$$Thr = \frac{V_j(i)(i\Delta T)}{xCap} \frac{dV_j(i)}{dSOC_j(i)} \qquad \text{Eq. (8)}$$

where the prognostic threshold is on the right-hand side of Eq. (8). Cap is the cell capacity of the battery cell and x is a specified cell short resistance, such as about 500Ω. In one embodiment, the mean voltage $\overline{V}_j(i)$ is given by Eq. (9):

$$\overline{V}_j(i) = \frac{1}{i\Delta T}\int_0^{i\Delta T}(V_j(t)-V_m(t))dt \approx V_j(i)-V_m(i) \qquad \text{Eq. (9)}$$

In another embodiment, the threshold Thr is a difference between the mean of the voltage drops over the n battery cells in the battery module or battery pack and a multiple of a standard deviation σ, as shown in Eq. (10):

$$Thd=1/n\Sigma_{j=0}^{n}dV_j(i)-k\sigma(dV_j(i)) \qquad \text{Eq. (10)}$$

Similar calculations can be determined TRA using a drop rate in state of charge (SOC). The SOC is determined from the voltage measurements using the function represented in FIG. 12, as shown in the function of Eq. (11)

$$SOC(i)=f_{voc2soc}(V(i)) \qquad \text{Eq. (11)}$$

The change in SOC is thus given by Eq. (12):

$$dSOC_j(i)=f_{voc2soc}(V_j(i))-f_{voc2soc}(V_j(1)) \qquad \text{Eq. (12)}$$

Similar to the voltage drop method, if cell balancing of the battery pack is on-going, the amount of natural discharge due to cell balancing is to be removed from the determined state of charge shown in Eq. (11) before calculating the change of SOC in Eq. (12). The change in the SOC for the battery cell over the time frame is compared to a prognostic threshold, as shown in Eq. (13):

$$Thr = \left(\frac{\overline{V}_j(i)(i\Delta T)}{xCap}\right) \qquad \text{Eq. (13)}$$

If the $dSOC_j(i)$ is greater than the threshold, an alarm is generated. In another embodiment, the threshold is based on as a difference between a mean delta SOC (dSOC) over all battery cells of the battery pack and a multiple of a standard deviation of the delta SOC, as shown in Eq. (14):

$$Thd=1/n\Sigma_{j=0}^{n}dSOC_j(i)-k\sigma(dSOC_j(i)) \qquad \text{Eq. (14)}$$

Figure 14:
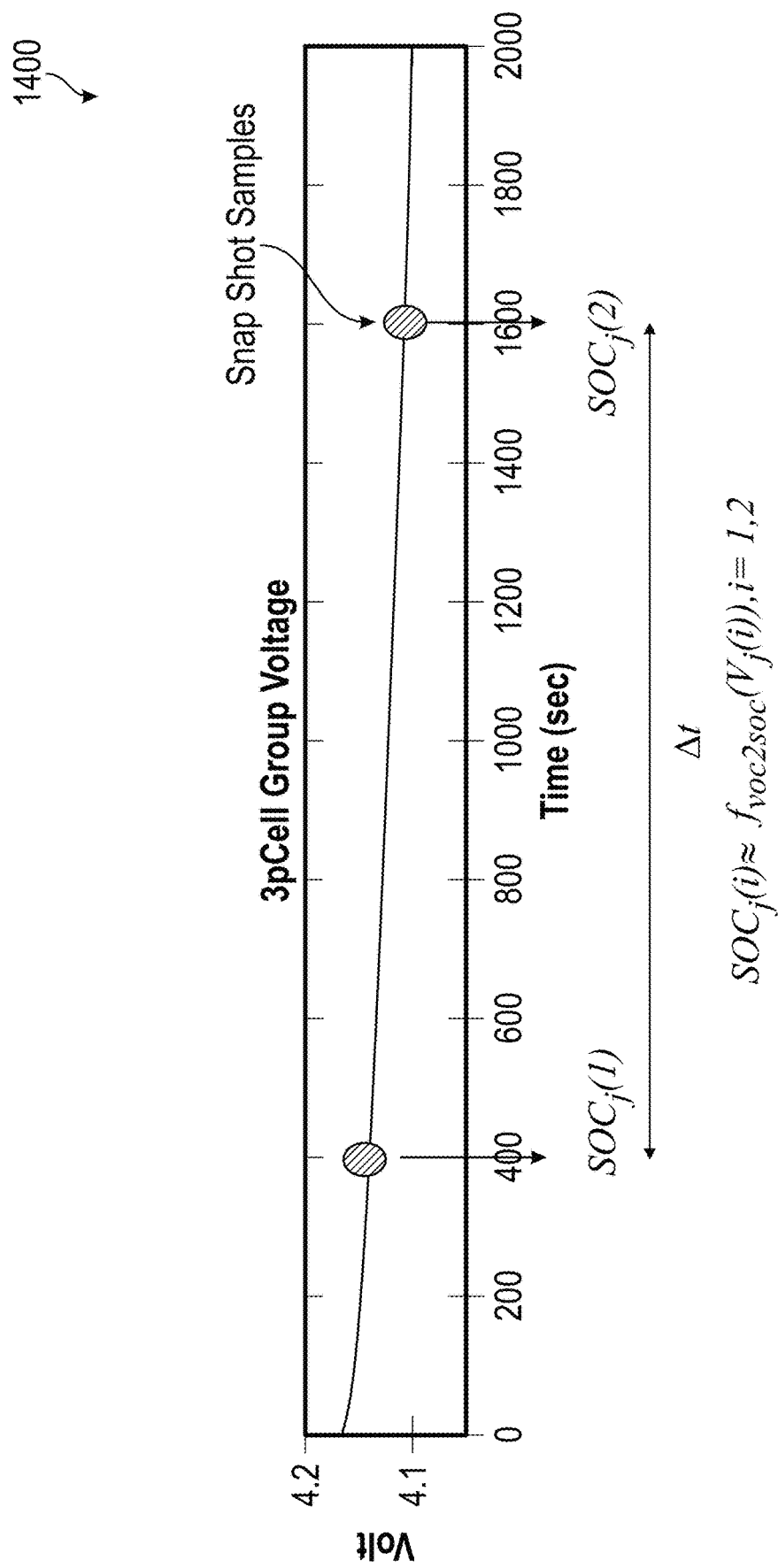
FIG. 14 shows a graph illustrating a third method for determining a presence of an internal short resistance.

FIG. 14 shows a graph 1400 illustrating a third method for determining a presence of an internal short resistance. Voltage measurements are obtained at a first time (e.g., about 400 seconds) and at a second time (e.g., about 1600 seconds) for each of 'n' battery cells of a battery pack. The state of charge for $SOC_j(i)$ for the $j^{th}$ battery cell at the $i^{th}$ time step is determined from the voltages using the function represented in FIG. 12.

Figure 15:
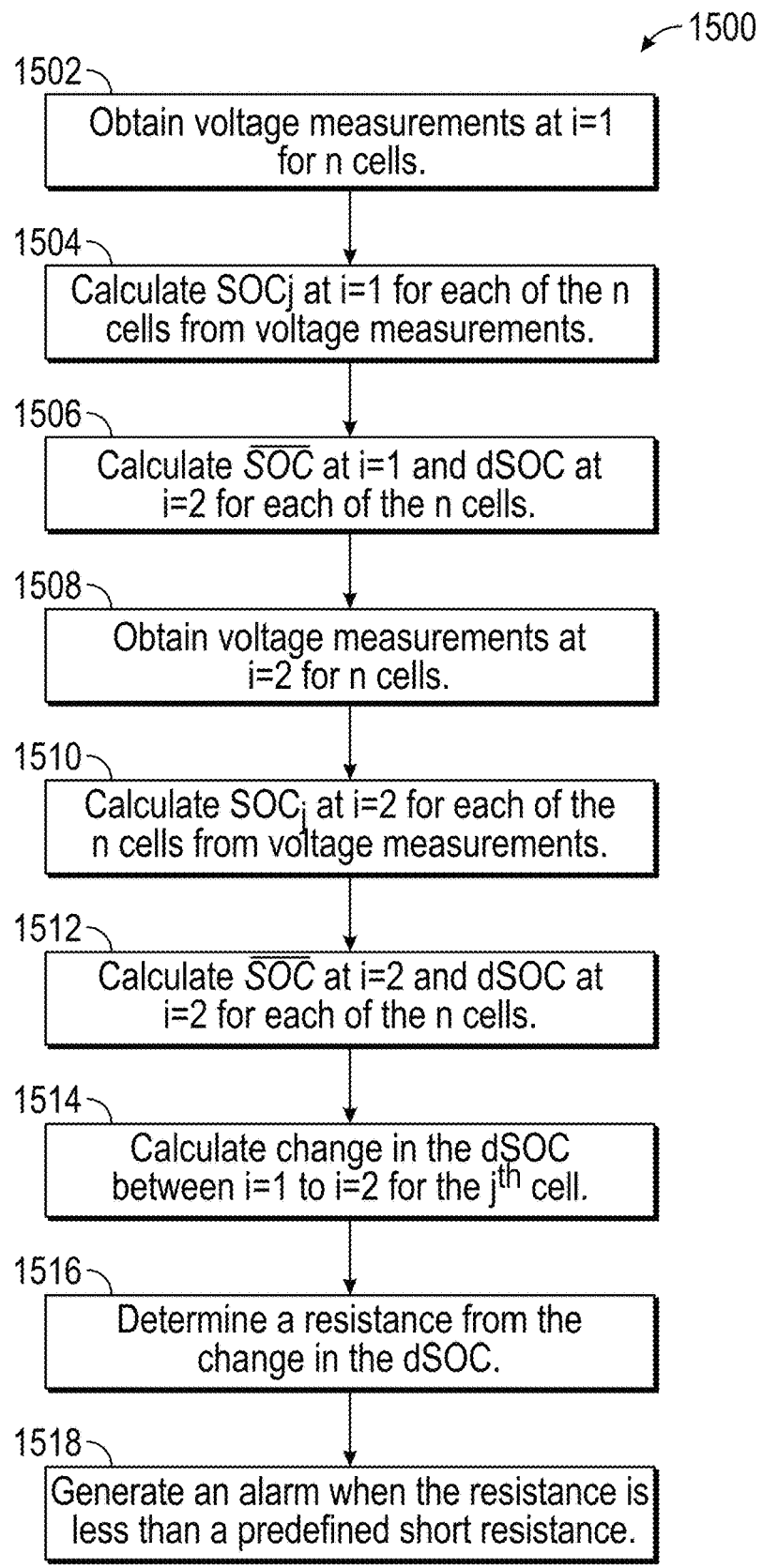
FIG. 15 shows a flowchart of a method for predicting thermal runaway from a change in a stage of charge of a battery cell.

FIG. 15 shows a flowchart 1500 of a method for predicting TRA from a change in a stage of charge of a battery cell. At box 1502, voltage measurements are obtained for 'n' cells of the battery pack and a first sample time (i=1). At box 1504, the state of charge at i=1 ($SOC_j(1)$) is determined for each of the 'n' cells. At box 1506, a mean state of charge value is determined for the 'n' cells and a deviation in the SOC for the 'n' cells is determined, as given in Eq. (15):

$$dSOC_j(1)=\overline{SOC(1)}-SOC_j(1) \qquad \text{Eq. (15)}$$

where $dSOC_j(1)$ is the deviation in state of charge of the $j^{th}$ cell at time i=1, $\overline{SOC(1)}$ is the average state of charge for the 'n' cells at time i=1, and $SOC_j(1)$ is the SOC of the $j^{th}$ cell at time i=1.

At box 1508, voltage measurements are obtained for the 'n' cells at a second sample time (i=2). At box 1510, the state of charge at i=2 ($SOC_j(2)$) is determined for each of the 'n' cells. At box 1512, a mean state of charge value is determined for the 'n' cells and a deviation in the SOC for each of the 'n' cells is determined, as given in Eq. (16):

$$dSOC_j(2)=\overline{SOC(2)}-SOC_j(2) \qquad \text{Eq. (16)}$$

where $dSOC_j(2)$ is the deviation in state of charge of the $j^{th}$ cell at time i=2, $\overline{SOC(2)}$ is the average state of charge for the 'n' cells at time i=2, and $SOC_j(2)$ is the SOC of the $j^{th}$ cell at time i=2.

In box 1514, the change in the state of charge between time i=1 and time i=2 is determined. The impact of cell balancing on an individual cell can be compensated for based using a balancing percent based on amp-hours over the time interval Δt. In an embodiment, the balancing percent is given in Eq. (17):

$$BalPct = \frac{\overline{Ahr}-Ahr(j)}{Cap} \qquad \text{Eq. (17)}$$

where Ahr(j) is the balanced amp-hours of the $j^{th}$ cell, $\overline{Ahr}$ is the average amp-hours of the 'n' cells of the battery pack and Cap is the cell capacity. The change in the dSOCs for the jth cell is given in Eq. (18):

$$ddSOC(j)=dSOC_j(2)-dSOC_j(1)+BalPct \qquad \text{Eq. (18)}$$

In box 1516, a shorting resistance R is then calculated the results of Eq. (18), as shown in Eq. (19):

$$R_j = \frac{V_j(2)\cdot \Delta t}{ddSOC(j)\cdot Cap} \qquad \text{Eq. (19)}$$

In box 1518, each shorting resistance $R_j$ is compared to a resistance threshold and an alarm is generated if the a $R_j$ is less than the resistance threshold, indicating a short circuit.

Figure 16:
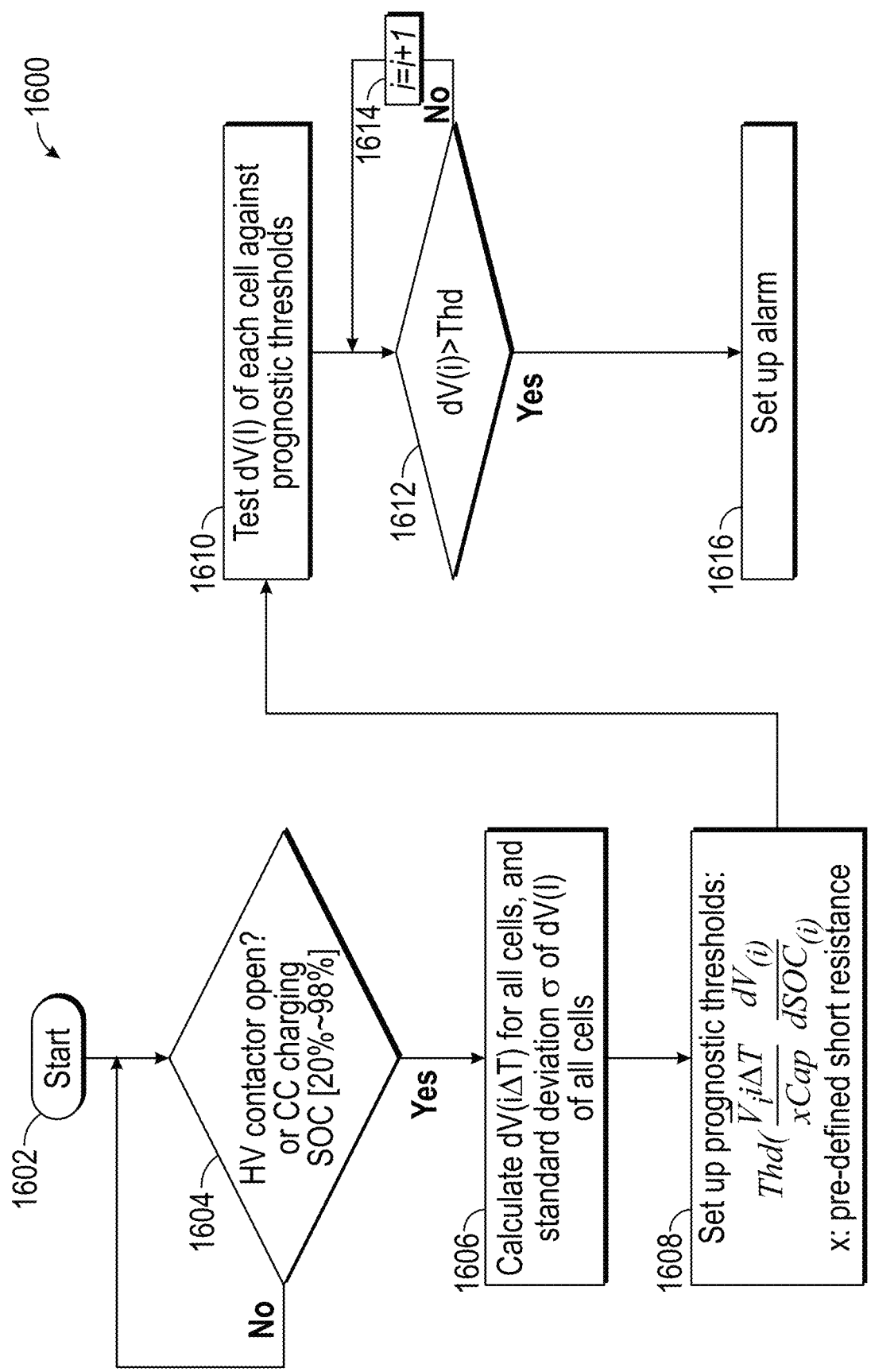
FIG. 16 shows a flowchart of a method for prognosticating a thermal runaway condition and providing an alarm.

FIG. 16 shows a flowchart 1600 of the second method for prognosticating a thermal runaway condition and providing an alarm. The method applies to each cell and begins at box 1602. At box 1604, the method tests for whether a high voltage contact is open or if constant current charging of the battery is occurring. If these are not present then the method loops back to box 1602. If either condition is present, the method proceeds to box 1606. In box 1606, a mean value and standard deviation is calculated based on measurements obtained from the battery pack. The measurement is a delta voltage of a battery cell calculated by Eq. (7). In one embodiment, the mean value can be the mean of delta voltages of all cells in a module or a pack, and the standard deviation is a standard deviation of these delta voltages. In box 1608, prognostic thresholds are set up based on calibrations or based on the standard deviation. The threshold can be for example, the prognostic threshold of Eqs. (8) and (10), or derivations thereof. In box 1610, the deviation of the voltage is measured for the 'n' cells at different time interval (i·ΔT). In box 1612, the deviation of a cell at time (i) is measured against the threshold. If the deviation is less than the threshold, the method proceeds to box 1614 in which the time interval is increased by a time step. From box 1614, the method loops back to box 1612. If the deviation is greater than the threshold, the method proceeds to box 1616 in which an alarm is generated. Similar prognostic flow chart in FIG. 16 can be applied to the deviation of the state of charge, where the deviation of voltage based method dV(i) can be replaced by dSOC(i), and test against thresholds in Eq. (13) and (14).

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method of monitoring an occurrence of thermal runaway in a battery pack, comprising:
   obtaining a plurality of voltage measurements at each of a plurality of battery cells of the battery pack between a trailing time edge of a moving time window and a current time edge of the moving time window;
   determining a mean voltage based on the plurality of voltage measurements obtained between the trailing time edge and the current time edge;
   determining a residual for a selected battery cell, wherein the residual is a difference between a voltage obtained after the moving time window for the selected battery cell and the mean voltage;
   comparing the residual for the selected battery cell to a prognostic threshold, wherein the prognostic threshold is an integer multiple of a standard deviation of the plurality of voltage measurements obtained between the trailing time edge and the current time edge about the mean voltage; and
   generating a notification signal when the residual for the selected battery cell is greater than or equal to the prognostic threshold.

2. The method of claim 1, further comprising determining at least one of: (i) a voltage of the selected battery cell; (ii) a state of charge of the selected battery cell; (iii) a rate of change of voltage over time of the selected battery cell; and (iv) a rate of change of a state of charge over time of the selected battery cell.

3. The method of claim 1 wherein obtaining the plurality of voltage measurements at each of a plurality of battery cells of the battery pack includes obtaining a first plurality of voltage measurements at a first time and a second plurality of voltage measurements at a second time, further comprising:
   determining a first plurality of states of charge for each of the plurality of battery cells from the first plurality of voltage measurements;
   determining a first mean state of charge from the first plurality of states of charge;
   determining a first deviation of a state of charge of a selected battery from the first mean state of charge at the first time;
   determining a second plurality of states of charge for each of the plurality of battery cells from the second plurality of voltage measurements;
   determining a second mean state of charge from the plurality of states of charge;
   determining a second deviation of the state of charge of the selected battery from the second mean state of charge at the second time;
   determining a difference between the first deviation and the second deviation; and
   determining a shorting resistance of the selected battery cell from the difference.

4. The method of claim 1, wherein the prognostic threshold is one of: (i) 4 times the standard deviation; and (ii) 6 times the standard deviation.

5. The method of claim 1, further comprising obtaining the plurality of voltage measurements between a trailing time edge of a time window and a current time edge of the time window and obtaining the voltage measurement from the selected battery cell at the current time edge of the time window.

6. The method of claim 5, further comprising determining the standard deviation from the voltage measurements obtained over the time window.

7. The method of claim 6, further comprising correcting a voltage for a discharge of the selected battery cell due to cell balancing.

8. A system for monitoring an occurrence of thermal runaway in a battery pack of a vehicle, comprising:
   a plurality of voltage sensors for obtaining a plurality of voltage measurements at each of a plurality of battery cells of the battery pack between a trailing time edge of a moving time window and a current time edge of the moving time window; and
   a processor configured to:
      determine a mean voltage based on the plurality of voltage measurements obtained between the trailing time edge and the current time edge;
      determine a residual for a selected battery cell, wherein the residual is a difference between a voltage obtained after the moving time window for the selected battery cell and the mean voltage;
      compare the residual for the selected battery cell to a prognostic threshold, wherein the prognostic threshold is an integer multiple of a standard deviation of the plurality of voltage measurements obtained between the trailing time edge and the current time edge about the mean voltage; and
      generate a notification signal when the residual is greater than or equal to the prognostic threshold.

9. The system of claim 8, wherein the processor is further configured to determine at least one of: (i) a voltage of the selected battery cell; (ii) a state of charge of the selected battery cell; (iii) a rate of change of voltage over time of the selected battery cell; and (iv) a rate of change of a state of charge over time of the selected battery cell.

10. The system of claim 8, wherein the prognostic threshold is one of: (i) 4 times the standard deviation; and (ii) 6 times the standard deviation.

11. The system of claim 8, wherein the plurality of voltage sensors is further configured to obtain the plurality of voltage measurements between a trailing time edge of a time window and a current time edge of the time window and obtain the voltage measurement from the selected battery cell at the current time edge of the time window.

12. The system of claim 11, wherein the processor is further configured to determine the standard deviation from the voltage measurements obtained over the time window.

13. The system of claim 8, wherein obtaining the plurality of voltage measurements at each of a plurality of battery cells of the battery pack includes obtaining a first plurality of voltage measurements at a first time and a second plurality of voltage measurements at a second time, further comprising:
   determining a first plurality of states of charge for each of the plurality of battery cells from the first plurality of voltage measurements;
   determining a first mean state of charge from the first plurality of states of charge;
   determining a first deviation of a state of charge of a selected battery from the first mean state of charge at the first time;

determining a second plurality of states of charge for each of the plurality of battery cells from the second plurality of voltage measurements;

determining a second mean state of charge from the plurality of states of charge;

determining a second deviation of the state of charge of the selected battery from the second mean state of charge at the second time;

determining a difference between the first deviation and the second deviation; and determining a shorting resistance of the selected battery cell from the difference.

14. The system of claim 13, wherein the processor is further configured to correct a voltage for a discharge of the selected battery cell due to cell balancing.

15. A vehicle, comprising:

a battery pack having a plurality of battery cells;

a plurality of voltage sensors for obtaining a plurality of voltage measurements at each of the plurality of battery cells between a trailing time edge of a moving time window and a current time edge of the moving time window; and a processor configured to:
 determine a mean voltage based on the plurality of voltage measurements obtained between the trailing time edge and the current time edge;
 determine a residual for a selected battery cell, wherein the residual is a difference between a voltage obtained after the moving time window for the selected battery cell and the mean voltage;
 compare the residual for the selected battery cell to a prognostic threshold, wherein the prognostic threshold is an integer multiple of a standard deviation of the plurality of voltage measurements obtained between the trailing time edge and the current time edge about the mean voltage; and
 generate a notification signal when the residual is greater than or equal to the prognostic threshold.

16. The vehicle of claim 15, wherein the processor is further configured to determine at least one of: (i) a voltage of the selected battery cell; (ii) a state of charge of the selected battery cell; (iii) a rate of change of voltage over time of the selected battery cell; and (iv) a rate of change of a state of charge over time of the selected battery cell.

17. The vehicle of claim 15, wherein obtaining the plurality of voltage measurements at each of a plurality of battery cells of the battery pack includes obtaining a first plurality of voltage measurements at a first time and a second plurality of voltage measurements at a second time, further comprising:

determining a first plurality of states of charge for each of the plurality of battery cells from the first plurality of voltage measurements;

determining a first mean state of charge from the first plurality of states of charge;

determining a first deviation of a state of charge of a selected battery from the first mean state of charge at the first time;

determining a second plurality of states of charge for each of the plurality of battery cells from the second plurality of voltage measurements;

determining a second mean state of charge from the plurality of states of charge;

determining a second deviation of the state of charge of the selected battery from the second mean state of charge at the second time;

determining a difference between the first deviation and the second deviation; and determining a shorting resistance of the selected battery cell from the difference.

18. The vehicle of claim 15, wherein the prognostic threshold is one of: (i) 4 times the standard deviation; and (ii) 6 times the standard deviation.

19. The vehicle of claim 15, wherein the plurality of voltage sensors is further configured to obtain the plurality of voltage measurements between a trailing time edge of a time window and a current time edge of the time window and obtain the voltage measurement from the selected battery cell at a same time step the current time edge of the time window.

20. The vehicle of claim 19, wherein the processor is further configured to determine the standard deviation from the voltage measurements obtained over the time window.

* * * * *